United States Patent [19]

Schouhamer Immink

[11] Patent Number: 5,642,113
[45] Date of Patent: Jun. 24, 1997

[54] METHODS AND DEVICES FOR CONVERTING A SEQUENCE OF M-BIT INFORMATION WORDS TO A MODULATED SIGNAL AND INCLUDING THAT SIGNAL ON A RECORD CARRIER, DEVICES FOR DECODING THAT SIGNAL AND READING IT FROM A RECORD CARRIER, AND THAT SIGNAL

[75] Inventor: Kornelis A. Schouhamer Immink, Eindhoven, Netherlands

[73] Assignee: U.S. Philips Corporation, New York, N.Y.

[21] Appl. No.: 388,865

[22] Filed: Feb. 15, 1995

[30] Foreign Application Priority Data

Apr. 5, 1994 [EP] European Pat. Off. ............ 94200922

[51] Int. Cl.⁶ .................................................. H03M 5/00
[52] U.S. Cl. ............................................................ 341/58
[58] Field of Search ........................ 341/58, 51, 102; 360/40, 77.13; 375/19

[56] References Cited

U.S. PATENT DOCUMENTS 4,387,364  6/1983  Shirota ........................... 358/261
5,136,436  8/1992  Kahlman ........................... 360/40

FOREIGN PATENT DOCUMENTS 0150082  7/1995  European Pat. Off. ......... H03M 5/14

Primary Examiner—Brian K. Young
Attorney, Agent, or Firm—Richard A. Weiss

[57] ABSTRACT

A sequence of m-bit information words is converted to a modulated binary signal. For each received information word from the sequence an n-bit code word is delivered. The delivered code words are converted to the modulated signal. When one of the code words is assigned to an information word to be converted, this code word is selected from a set of code words that depends on a coding state which is related to a digital sum value at the end of the modulated signal that corresponds to the previously delivered code word. From at least one of the digital sum values, a first or a second coding state of a pair of coding states of a first type is determined. Which of the two coding state of the pair is determined depends on the information word that corresponds to the previous delivered code word. The sets of code words belonging to the pairs of coding states of the first type contain no code word whatsoever in common. Because of this, the number of unique bit combinations that can be established by the code words in the sequence is increased.

35 Claims, 13 Drawing Sheets

FIG. 2a

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 0 | 010101011 | 7 | 010101001 | 7 | 010101011 | 5 | 010101001 | 5 | 010101011 | 3 | 010101001 | 3 | 010101011 | 1 |
| 1 | 010101101 | 7 | 010101101 | 5 | 010001101 | 5 | 010101101 | 3 | 010001101 | 5 | 010101101 | 1 | 100001101 | 3 |
| 2 | 010101110 | 5 | 010101100 | 7 | 010101110 | 3 | 010101100 | 5 | 010101110 | 3 | 010101100 | 3 | 010101110 | 1 |
| 3 | 010101111 | 4 | 100101010 | 7 | 010101111 | 2 | 100101010 | 4 | 000101010 | 7 | 100101010 | 2 | 000101010 | 5 |
| 4 | 010110011 | 7 | 100101010 | 6 | 010101111 | 5 | 100101010 | 5 | 100101010 | 3 | 100101010 | 3 | 010101010 | 3 |
| 5 | 010110011 | 7 | 010110001 | 7 | 010110011 | 3 | 010110001 | 5 | 010110011 | 1 | 010110001 | 1 | 100100101 | 3 |
| 6 | 010110101 | 5 | 010110101 | 5 | 010010101 | 5 | 010110101 | 3 | 010010101 | 3 | 010110101 | 3 | 010110101 | 1 |
| 7 | 010110110 | 4 | 010110100 | 6 | 010110110 | 2 | 010110100 | 4 | 010110110 | 3 | 010110100 | 2 | 010110110 | 5 |
| 8 | 010110111 | 7 | 100110010 | 7 | 010110111 | 5 | 100110010 | 5 | 000110010 | 7 | 100110010 | 3 | 000110010 | 3 |
| 9 | 010111001 | 5 | 010111010 | 7 | 010111001 | 3 | 010111010 | 5 | 010111001 | 3 | 010111010 | 3 | 010111001 | 1 |
| 10 | 010111010 | 5 | 010111001 | 7 | 010111010 | 5 | 010111001 | 3 | 010111010 | 5 | 010111001 | 1 | 100111001 | 1 |
| 11 | 010111010 | 6 | 010111000 | 5 | 010011101 | 2 | 010111000 | 2 | 000111000 | 7 | 010111000 | 2 | 000011000 | 5 |
| 12 | 010111100 | 4 | 101000011 | 7 | 100111100 | 7 | 101000011 | 7 | 000111100 | 7 | 101000011 | 4 | 001000011 | 3 |
| 13 | 010111101 | 7 | 101000001 | 7 | 010011110 | 7 | 101000001 | 5 | 001000001 | 5 | 101000001 | 2 | 001000001 | 2 |
| 14 | 010111101 | 3 | 010111101 | 6 | 010111101 | 3 | 010111101 | 2 | 100111100 | 3 | 010111101 | 7 | 101000001 | 3 |
| 15 | 010111110 | 2 | 010111100 | 5 | 010111110 | 3 | 010111100 | 7 | 100011100 | 2 | 000111100 | 6 | 100011100 | 7 |
| 16 | 010111110 | 7 | 100111101 | 4 | 001111110 | 6 | 100011101 | 6 | 001011100 | 7 | 000010001 | 5 | 001011100 | 3 |
| 17 | 010111111 | 3 | 101000110 | 3 | 001011010 | 5 | 001000110 | 5 | 001011010 | 5 | 001010100 | 4 | 010011010 | 1 |
| 18 | 010011011 | 4 | 101000110 | 2 | 101000011 | 3 | 101000110 | 4 | 001000110 | 4 | 001010001 | 3 | 010000100 | 3 |
| 19 | 010111011 | 5 | 010111100 | 7 | 101011011 | 7 | 010011100 | 5 | 001001100 | 5 | 010110100 | 2 | 101000110 | 2 |
| 20 | 011001101 | 7 | 010111011 | 5 | 011001101 | 3 | 010011011 | 5 | 010011011 | 3 | 010011011 | 3 | 010011011 | 1 |
| 21 | 011001101 | 7 | 011001101 | 4 | 111001101 | 3 | 101001101 | 5 | 100001101 | 3 | 101001101 | 3 | 100001101 | 3 |
| 22 | 011011100 | 5 | 010011100 | 7 | 011001110 | 2 | 010011100 | 3 | 010001110 | 3 | 010011100 | 3 | 010011110 | 1 |
| 23 | 011011100 | 3 | 011001110 | 5 | 111001111 | 5 | 011001110 | 2 | 001001110 | 5 | 011001110 | 2 | 001001110 | 3 |
| 24 | 011010010 | 3 | 011010010 | 7 | 011010010 | 5 | 011010010 | 5 | 010010010 | 3 | 011010010 | 1 | 010010010 | 3 |
| 25 | 011010101 | 7 | 011010101 | 5 | 011010101 | 3 | 011010101 | 5 | 011010101 | 1 | 011010101 | 3 | 011010101 | 1 |
| 26 | 011010110 | 5 | 011010100 | 7 | 011010110 | 3 | 011010100 | 5 | 001010100 | 3 | 011010100 | 3 | 001010100 | 1 |
| 27 | 011010111 | 4 | 100010010 | 6 | 011010111 | 2 | 101010010 | 3 | 001010010 | 7 | 101010010 | 3 | 001010010 | 3 |
| 28 | 011011001 | 7 | 011011011 | 7 | 011011011 | 5 | 011010010 | 5 | 011010010 | 3 | 011010010 | 3 | 011010010 | 1 |
| 29 | 011011001 | 5 | 100010100 | 4 | 011011001 | 5 | 100010101 | 3 | 000010100 | 5 | 100010101 | 2 | 000010100 | 1 |
| 30 | 011011001 | 4 | 011011001 | 5 | 111011001 | 3 | 011011001 | 5 | 100010100 | 2 | 011011001 | 1 | 100010000 | 1 |
| 31 | 011011010 | 7 | 011011000 | 7 | 011011010 | 5 | 011011000 | 3 | 011011010 | 5 | 011011000 | 3 | 011011010 | 1 |

FIG. 2b

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 32 | 01011011 | 5 | 101100010 | 7 | 011011011 | 3 | 101100010 | 5 | 001100010 | 7 | 101100010 | 3 | 001100010 | 5 |
| 33 | 01011011 | 4 | 101100010 | 6 | 011011011 | 2 | 101100010 | 4 | 101100000 | 7 | 101100010 | 2 | 101100000 | 5 |
| 34 | 01011100 | 7 | 011011100 | 5 | 110011100 | 7 | 011011100 | 3 | 100011000 | 5 | 000011000 | 7 | 100011000 | 3 |
| 35 | 01011100 | 6 | 011011100 | 4 | 100100001 | 7 | 011011100 | 2 | 100110001 | 5 | 000010100 | 6 | 100110001 | 3 |
| 36 | 01011101 | 5 | 011011101 | 3 | 101010011 | 6 | 001010100 | 7 | 101010001 | 5 | 001010100 | 5 | 101010001 | 2 |
| 37 | 01011101 | 4 | 011011101 | 2 | 001010110 | 3 | 001010100 | 4 | 001010110 | 4 | 001010100 | 4 | 001010110 | 2 |
| 38 | 01011110 | 7 | 110000011 | 7 | 011011110 | 5 | 110000011 | 5 | 010000011 | 7 | 000010100 | 3 | 010000011 | 3 |
| 39 | 01011110 | 6 | 110000011 | 6 | 011011110 | 2 | 110000011 | 4 | 110000001 | 7 | 110000011 | 2 | 110000001 | 7 |
| 40 | 01100001 | 7 | 011100011 | 5 | 011100011 | 5 | 011100001 | 5 | 011100011 | 3 | 011100001 | 1 | 110000001 | 3 |
| 41 | 01100011 | 7 | 011100001 | 7 | 111100001 | 5 | 011100101 | 3 | 011100001 | 3 | 011100001 | 3 | 011100001 | 5 |
| 42 | 01100101 | 5 | 011100101 | 5 | 011100101 | 3 | 011100110 | 5 | 011100101 | 7 | 011100110 | 3 | 011100101 | 5 |
| 43 | 01100110 | 4 | 011100110 | 4 | 011100110 | 2 | 011100110 | 5 | 100000110 | 3 | 011100110 | 2 | 100000110 | 5 |
| 44 | 01100111 | 7 | 110000111 | 7 | 011100111 | 5 | 110000100 | 5 | 010000100 | 7 | 110000100 | 3 | 010000100 | 5 |
| 45 | 01100111 | 5 | 110000111 | 7 | 011100111 | 2 | 110000100 | 3 | 110000110 | 3 | 110000110 | 3 | 110000110 | 4 |
| 46 | 01101001 | 4 | 011101001 | 5 | 011101001 | 5 | 011101000 | 5 | 110001010 | 7 | 011101000 | 3 | 010001010 | 5 |
| 47 | 01101010 | 7 | 011101010 | 7 | 011101010 | 5 | 011101010 | 5 | 110001010 | 7 | 110001010 | 2 | 110001010 | 3 |
| 48 | 01101011 | 5 | 011101011 | 3 | 111101011 | 2 | 011101011 | 2 | 100001011 | 7 | 000001011 | 7 | 100001011 | 5 |
| 49 | 01101011 | 4 | 011101011 | 2 | 111101011 | 7 | 011101100 | 7 | 000110100 | 6 | 000010100 | 6 | 000110100 | 4 |
| 50 | 01101100 | 7 | 011101100 | 6 | 001010100 | 6 | 011101100 | 6 | 101010100 | 5 | 001010100 | 5 | 101010100 | 5 |
| 51 | 01101101 | 6 | 011101101 | 5 | 101010100 | 3 | 011101101 | 4 | 001010101 | 4 | 101010100 | 4 | 001010101 | 3 |
| 52 | 01101101 | 4 | 011101101 | 3 | 001010010 | 2 | 011101101 | 5 | 001010010 | 7 | 001010010 | 2 | 001010010 | 7 |
| 53 | 01101110 | 5 | 011101110 | 6 | 011101110 | 7 | 011101110 | 5 | 110010000 | 7 | 110010000 | 7 | 110010000 | 4 |
| 54 | 01101110 | 4 | 100100001 | 5 | 100100101 | 5 | 100100010 | 2 | 001100101 | 5 | 000100001 | 2 | 001100101 | 1 |
| 55 | 01110001 | 5 | 110100001 | 7 | 100100001 | 7 | 011100001 | 5 | 100100101 | 3 | 000100001 | 7 | 100111000 | 3 |
| 56 | 01110001 | 7 | 011110001 | 7 | 011110001 | 7 | 011110001 | 7 | 100111000 | 5 | 100111000 | 5 | 100111000 | 3 |
| 57 | 01110010 | 6 | 110100001 | 6 | 011110010 | 6 | 110100010 | 5 | 011110000 | 3 | 110100010 | 3 | 011110000 | 3 |
| 58 | 01110010 | 5 | 110100010 | 5 | 011110010 | 4 | 110100010 | 4 | 010100010 | 2 | 110100010 | 3 | 010100010 | 2 |
| 59 | 01110011 | 4 | 110100011 | 4 | 011110011 | 2 | 110100010 | 4 | 010100010 | 7 | 110100010 | 3 | 010100010 | 2 |
| 60 | 01110011 | 5 | 110100011 | 2 | 011110011 | 2 | 110100100 | 5 | 010100010 | 6 | 000010100 | 3 | 010100010 | 2 |
| 61 | 01110100 | 7 | 011110100 | 5 | 111110100 | 2 | 011110100 | 3 | 000010011 | 5 | 000010001 | 7 | 000010011 | 5 |

FIG. 2c

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 62 | 011110100 | 6 | 011110100 | 4 | 101000101 | 7 | 011110100 | 2 | 101000101 | 5 | 000100100 | 6 | 101000101 | 3 |
| 63 | 011110101 | 5 | 011110101 | 3 | 101011000 | 7 | 001011000 | 7 | 101011000 | 5 | 001011000 | 5 | 101011000 | 3 |
| 64 | 011110101 | 4 | 011110101 | 2 | 001100011 | 6 | 001100001 | 6 | 001100011 | 4 | 001100001 | 4 | 001100011 | 2 |
| 65 | 011110110 | 5 | 111000010 | 7 | 011110110 | 3 | 111000010 | 5 | 011110110 | 7 | 011000010 | 7 | 011000010 | 5 |
| 66 | 011110110 | 4 | 111000010 | 6 | 011110110 | 2 | 111000010 | 4 | 011110110 | 6 | 011000010 | 6 | 011000010 | 4 |
| 67 | 011111000 | 7 | 011111000 | 5 | 100101001 | 7 | 011111000 | 3 | 100101001 | 5 | 100101001 | 5 | 100101001 | 3 |
| 68 | 011111000 | 6 | 011111000 | 4 | 101001001 | 7 | 001111000 | 2 | 101001001 | 5 | 000100100 | 7 | 101001001 | 3 |
| 69 | 011111001 | 5 | 011111001 | 3 | 101100001 | 6 | 011100001 | 7 | 101100001 | 4 | 001100001 | 5 | 101100001 | 2 |
| 70 | 011111001 | 4 | 011111001 | 2 | 001100110 | 5 | 001100110 | 6 | 001100110 | 6 | 001100110 | 4 | 001100110 | 5 |
| 71 | 011111010 | 5 | 000101101 | 6 | 011111010 | 3 | 000101101 | 4 | 000010111 | 4 | 000010111 | 2 | 000010111 | 3 |
| 72 | 011111010 | 4 | 001011100 | 5 | 011111010 | 2 | 000101111 | 3 | 000010110 | 5 | 000010110 | 4 | 000010110 | 1 |
| 73 | 100101011 | 7 | 011111100 | 5 | 100101011 | 5 | 001101000 | 7 | 101101011 | 5 | 101101011 | 3 | 101100011 | 3 |
| 74 | 100101100 | 7 | 011111100 | 4 | 100101100 | 5 | 001101011 | 6 | 001101010 | 4 | 001101010 | 4 | 001101010 | 1 |
| 75 | 001101101 | 6 | 000101101 | 7 | 001101101 | 5 | 001101010 | 3 | 000101101 | 5 | 101001011 | 3 | 000101101 | 3 |
| 76 | 100101101 | 7 | 000101110 | 5 | 100101101 | 7 | 001101101 | 5 | 100101101 | 5 | 000101110 | 5 | 100101101 | 3 |
| 77 | 100101110 | 5 | 000101110 | 3 | 000110011 | 5 | 001101110 | 3 | 000101110 | 3 | 100101110 | 3 | 000101110 | 1 |
| 78 | 100110011 | 7 | 001101111 | 7 | 100110011 | 5 | 000110011 | 5 | 100110011 | 5 | 000110011 | 5 | 100110011 | 3 |
| 79 | 100110101 | 7 | 000110101 | 5 | 100110101 | 5 | 000110101 | 3 | 100110101 | 5 | 100110101 | 3 | 100110101 | 1 |
| 80 | 100110110 | 5 | 000110110 | 3 | 001110110 | 5 | 000110110 | 5 | 100110110 | 3 | 100110110 | 3 | 001110110 | 3 |
| 81 | 001101111 | 7 | 001101111 | 7 | 001101111 | 5 | 010001001 | 7 | 000111001 | 5 | 000111001 | 3 | 000111001 | 1 |
| 82 | 100111010 | 5 | 000111010 | 5 | 100111010 | 5 | 100111010 | 3 | 100111010 | 3 | 100111010 | 3 | 100111010 | 1 |
| 83 | 100111100 | 4 | 000111011 | 7 | 000111011 | 5 | 000111011 | 3 | 000111011 | 5 | 000111100 | 5 | 000111100 | 3 |
| 84 | 100111100 | 5 | 000111100 | 3 | 001111100 | 5 | 000011100 | 2 | 001111100 | 3 | 100011100 | 3 | 000111100 | 1 |
| 85 | 100111011 | 7 | 000111011 | 5 | 100111011 | 5 | 000011110 | 6 | 000111110 | 3 | 000011110 | 3 | 010000110 | 2 |
| 86 | 100111011 | 6 | 000111101 | 3 | 000111100 | 3 | 000111110 | 5 | 000111110 | 3 | 000111110 | 2 | 100010010 | 7 |
| 87 | 010111100 | 4 | 001111110 | 6 | 010011100 | 5 | 010011100 | 3 | 010001110 | 3 | 010000110 | 4 | 010000110 | 6 |
| 88 | 100111100 | 5 | 001111011 | 7 | 000111111 | 3 | 001111100 | 3 | 001111100 | 3 | 001111100 | 3 | 100010000 | 1 |
| 89 | 100111101 | 4 | 001111110 | 2 | 001111100 | 2 | 001111100 | 2 | 001110111 | 6 | 001111100 | 1 | 010001101 | 4 |
| 90 | 100111101 | 7 | 001111111 | 6 | 001111101 | 6 | 001111101 | 6 | 001000010 | 3 | 001100100 | 4 | 010001101 | 1 |
| 91 | 100111110 | 5 | 001111110 | 5 | 000111110 | 2 | 000111111 | 5 | 000111111 | 5 | 000100101 | 5 | 000111110 | 4 |
| 92 | 100111110 | 4 | 001111110 | 3 | 010010011 | 2 | 010010011 | 6 | 010010011 | 4 | 010010001 | 4 | 010010011 | 2 |

FIG. 2d

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 93 | 101001011 | 7 | 101001011 | 5 | 001001011 | 5 | 101001011 | 3 | 001001011 | 5 | 101001011 | 1 | 001001011 | 3 |
| 94 | 101001101 | 7 | 101001101 | 7 | 101001101 | 7 | 001001101 | 5 | 101001101 | 3 | 001001101 | 3 | 101001101 | 1 |
| 95 | 101001110 | 5 | 101001111 | 5 | 001001111 | 5 | 001001110 | 5 | 001001110 | 5 | 001001110 | 1 | 001001110 | 3 |
| 96 | 101001111 | 4 | 101001111 | 3 | 001001111 | 3 | 001000101 | 6 | 001001111 | 3 | 001000101 | 5 | 010010111 | 1 |
| 97 | 101001111 | 7 | 101001111 | 2 | 001010011 | 2 | 010010100 | 6 | 001010011 | 4 | 010010100 | 4 | 010010110 | 2 |
| 98 | 101010011 | 7 | 101010011 | 5 | 001010011 | 5 | 101010011 | 3 | 001010011 | 3 | 101010011 | 1 | 001010011 | 3 |
| 99 | 101010101 | 5 | 001010101 | 5 | 001010101 | 5 | 001010101 | 5 | 001010101 | 3 | 001010101 | 3 | 101010101 | 1 |
| 100 | 101010110 | 4 | 101010110 | 2 | 001010110 | 6 | 001010110 | 5 | 001010110 | 3 | 001010110 | 5 | 001010110 | 3 |
| 101 | 101010111 | 7 | 101010111 | 7 | 001010111 | 7 | 001001001 | 7 | 001010111 | 4 | 001001001 | 5 | 001010111 | 2 |
| 102 | 101011001 | 5 | 101011001 | 5 | 101011001 | 5 | 010011000 | 6 | 101011001 | 3 | 001011001 | 3 | 010011010 | 1 |
| 103 | 101011010 | 4 | 101010111 | 3 | 010011010 | 3 | 010011001 | 7 | 010011010 | 4 | 010011010 | 1 | 010011010 | 3 |
| 104 | 101011011 | 7 | 101011011 | 2 | 101011011 | 4 | 010011010 | 5 | 001011011 | 3 | 001011011 | 3 | 101011011 | 1 |
| 105 | 101011100 | 5 | 001011100 | 7 | 010111100 | 3 | 010011100 | 4 | 010011100 | 4 | 001011100 | 2 | 100100001 | 6 |
| 106 | 101011101 | 4 | 001011100 | 6 | 010011101 | 3 | 001011100 | 3 | 001011100 | 2 | 001011101 | 1 | 000011100 | 3 |
| 107 | 101011101 | 5 | 001011101 | 5 | 101011101 | 6 | 001011101 | 3 | 001011101 | 6 | 100011011 | 5 | 000011110 | 1 |
| 108 | 101011110 | 4 | 100011101 | 2 | 001011110 | 3 | 100011110 | 3 | 001011110 | 5 | 010011110 | 1 | 001011110 | 3 |
| 109 | 101011101 | 5 | 101011110 | 7 | 010100110 | 6 | 010100110 | 6 | 010100110 | 3 | 010100110 | 1 | 010100110 | 1 |
| 110 | 101100011 | 7 | 100100001 | 6 | 010100011 | 3 | 010100011 | 7 | 010100011 | 4 | 010100011 | 3 | 010100011 | 1 |
| 111 | 101100011 | 4 | 101100001 | 5 | 101100011 | 5 | 101100011 | 5 | 001100011 | 2 | 001100011 | 1 | 001100101 | 3 |
| 112 | 101100101 | 7 | 101100101 | 2 | 011100101 | 4 | 011100101 | 4 | 011100101 | 5 | 011100101 | 3 | 101100101 | 2 |
| 113 | 101100101 | 5 | 101100101 | 5 | 001100101 | 7 | 001100101 | 6 | 001100101 | 5 | 001100101 | 3 | 101100101 | 4 |
| 114 | 101100110 | 4 | 001100110 | 4 | 001100110 | 6 | 001100110 | 6 | 001100110 | 3 | 001100110 | 3 | 101100110 | 4 |
| 115 | 101100111 | 7 | 101100101 | 7 | 001100111 | 7 | 001100111 | 7 | 001100111 | 4 | 001100111 | 5 | 001101010 | 5 |
| 116 | 101101001 | 6 | 101101001 | 4 | 001101001 | 5 | 001101001 | 5 | 001101001 | 3 | 001101001 | 4 | 001101010 | 1 |
| 117 | 101101001 | 5 | 001101001 | 3 | 001101010 | 2 | 001101001 | 3 | 001101010 | 2 | 010101010 | 3 | 101101010 | 3 |
| 118 | 101101010 | 4 | 001101010 | 2 | 011101010 | 7 | 011101010 | 5 | 011101010 | 5 | 011101010 | 2 | 101101010 | 2 |
| 119 | 101101011 | 7 | 101101011 | 7 | 011101011 | 6 | 011101011 | 6 | 011101011 | 5 | 011101011 | 1 | 011101011 | 2 |
| 120 | 101101001 | 6 | 001101001 | 5 | 001101010 | 5 | 001101010 | 5 | 001101010 | 3 | 001101010 | 3 | 001101010 | 4 |
| 121 | 101101010 | 7 | 001101010 | 3 | 001101010 | 3 | 001101010 | 6 | 001101010 | 5 | 001101010 | 6 | 001101010 | 3 |
| 122 | 101101011 | 5 | 101101011 | 5 | 001101010 | 5 | 101101010 | 3 | 001101011 | 3 | 001101010 | 1 | 001101010 | 2 |
| 123 | 101101011 | 4 | 101010011 | 2 | 010110010 | 6 | 010110000 | 4 | 010110010 | 4 | 010110000 | 4 | 010110010 | 2 |

FIG. 2e

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 124 | 101101100 | 7 | 001101100 | 7 | 101101100 | 5 | 001101100 | 5 | 101101100 | 3 | 001101100 | 3 | 101100100 | 2 |
| 125 | 101101100 | 6 | 001101100 | 6 | 101101100 | 4 | 001101100 | 4 | 101101100 | 2 | 001101100 | 2 | 101100000 | 4 |
| 126 | 101101101 | 5 | 001101101 | 5 | 101101101 | 3 | 001101101 | 3 | 000100011 | 6 | 101000011 | 1 | 000100010 | 5 |
| 127 | 101101101 | 4 | 101101111 | 1 | 101101101 | 2 | 101101101 | 2 | 011001010 | 6 | 101101101 | 4 | 011001010 | 1 |
| 128 | 101101110 | 5 | 101101110 | 3 | 101101110 | 5 | 101101000 | 6 | 011101110 | 3 | 101101101 | 5 | 001101110 | 2 |
| 129 | 101101110 | 4 | 101101110 | 2 | 011000011 | 4 | 000100001 | 7 | 011000011 | 3 | 011000001 | 2 | 011000011 | 2 |
| 130 | 101110001 | 7 | 001110001 | 7 | 101110001 | 5 | 001110001 | 5 | 001110001 | 2 | 001110001 | 2 | 101010001 | 1 |
| 131 | 101110001 | 6 | 001110001 | 6 | 101110001 | 4 | 001110001 | 4 | 001110001 | 5 | 101101000 | 7 | 110000001 | 2 |
| 132 | 101110010 | 7 | 001110010 | 5 | 001110010 | 7 | 101110010 | 3 | 001110010 | 4 | 000110000 | 6 | 001110010 | 3 |
| 133 | 101110010 | 6 | 101110010 | 4 | 001110010 | 6 | 101110010 | 2 | 001110010 | 3 | 000010000 | 5 | 011110010 | 1 |
| 134 | 101110011 | 5 | 101110011 | 3 | 001110011 | 5 | 0111100 11 | 5 | 011100011 | 4 | 101010000 | 3 | 101010100 | 4 |
| 135 | 101110011 | 4 | 101110011 | 2 | 011110011 | 4 | 011110011 | 5 | 001110011 | 3 | 001110100 | 2 | 110010100 | 1 |
| 136 | 101110100 | 7 | 001110100 | 7 | 101110100 | 5 | 001110100 | 3 | 101110100 | 6 | 001110100 | 1 | 110010100 | 2 |
| 137 | 101110100 | 6 | 001110100 | 5 | 101110100 | 4 | 001110100 | 6 | 001110100 | 5 | 110110000 | 4 | 000100100 | 4 |
| 138 | 101110101 | 5 | 101110101 | 4 | 101110101 | 3 | 101110101 | 3 | 011001010 | 4 | 011001000 | 5 | 011001010 | 1 |
| 139 | 101110101 | 4 | 101110101 | 3 | 101110101 | 2 | 101110101 | 6 | 011101010 | 6 | 011001001 | 1 | 000110010 | 2 |
| 140 | 101110110 | 5 | 001110111 | 2 | 101110110 | 5 | 110000010 | 3 | 010010010 | 5 | 100001110 | 5 | 011001010 | 4 |
| 141 | 101110110 | 4 | 001110110 | 5 | 101110110 | 4 | 110001010 | 2 | 010010010 | 3 | 011000110 | 3 | 011001010 | 3 |
| 142 | 101111001 | 5 | 001111001 | 5 | 101111001 | 3 | 011001001 | 5 | 001110010 | 4 | 011001001 | 4 | 000001110 | 2 |
| 143 | 101111001 | 4 | 101111001 | 4 | 101111001 | 2 | 011001101 | 4 | 000011110 | 6 | 100001101 | 6 | 100001101 | 3 |
| 144 | 101111010 | 7 | 001111010 | 2 | 001111010 | 6 | 001111100 | 3 | 100100010 | 3 | 000010001 | 3 | 000110010 | 2 |
| 145 | 101111100 | 6 | 101111100 | 3 | 101111100 | 5 | 001111100 | 2 | 001100010 | 4 | 000100001 | 6 | 100001001 | 4 |
| 146 | 101111100 | 4 | 001111100 | 4 | 101111100 | 3 | 001111100 | 5 | 100100011 | 2 | 101100011 | 1 | 101100010 | 3 |
| 147 | 010001011 | 5 | 110001011 | 5 | 010001011 | 4 | 110001011 | 4 | 110001001 | 2 | 010001001 | 3 | 110000001 | 1 |
| 148 | 110001101 | 7 | 010001101 | 7 | 110001101 | 5 | 010001101 | 5 | 010001101 | 4 | 010001101 | 3 | 010000101 | 3 |
| 149 | 110001101 | 6 | 010001101 | 6 | 110001101 | 4 | 010001101 | 4 | 110001101 | 3 | 010001101 | 2 | 110000101 | 2 |
| 150 | 110001110 | 7 | 110001110 | 6 | 110001110 | 5 | 110001110 | 3 | 110001110 | 2 | 110001110 | 1 | 110001000 | 4 |
| 151 | 110001110 | 6 | 110001110 | 5 | 110001110 | 4 | 110001110 | 3 | 110001110 | 5 | 010010011 | 1 | 110001110 | 3 |
| 152 | 110010011 | 7 | 010010101 | 7 | 110010101 | 5 | 010010011 | 5 | 010010011 | 3 | 010010011 | 3 | 110010011 | 2 |
| 153 | 110010101 | 7 | 010010101 | 7 | 110010101 | 5 | 010010101 | 3 | 110010101 | 2 | 010010101 | 1 | 010010001 | 4 |
| 154 | 110010101 | 6 | 010010101 | 6 | 110010101 | 4 | 010010101 | 4 | 110010101 | 2 | 010010101 | 2 | 110010000 | 3 |

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 155 | 110010110 | 7 | 110010110 | 5 | 010010110 | 3 | 110010110 | 3 | 010010110 | 5 | 110010110 | 1 | 010010110 | 3 |
| 156 | 110010111 | 5 | 110010111 | 3 | 010010111 | 6 | 011001000 | 6 | 010010111 | 3 | 011001000 | 5 | 010010111 | 1 |
| 157 | 110010111 | 4 | 110010111 | 2 | 100010101 | 7 | 000010101 | 7 | 100010101 | 4 | 000010101 | 4 | 100010101 | 2 |
| 158 | 110011001 | 7 | 010011001 | 7 | 110011001 | 5 | 010011001 | 5 | 110011001 | 3 | 010011001 | 3 | 110011001 | 2 |
| 159 | 110011001 | 6 | 010011001 | 6 | 110011001 | 4 | 010011001 | 4 | 110011001 | 2 | 010011001 | 2 | 110011001 | 2 |
| 160 | 110011010 | 7 | 110011010 | 5 | 010011010 | 3 | 110011010 | 3 | 010011010 | 5 | 001000001 | 7 | 000011010 | 3 |
| 161 | 110011011 | 6 | 110011011 | 4 | 010011000 | 2 | 110011010 | 2 | 010011011 | 3 | 001000001 | 6 | 010011010 | 3 |
| 162 | 110011011 | 5 | 110011011 | 3 | 010011000 | 6 | 010011001 | 6 | 010011011 | 3 | 100000011 | 4 | 110011011 | 1 |
| 163 | 110011100 | 4 | 110011100 | 2 | 100011001 | 5 | 000011001 | 5 | 100011001 | 4 | 000011100 | 4 | 100011001 | 2 |
| 164 | 110011100 | 7 | 010011100 | 7 | 110011100 | 4 | 010011100 | 4 | 110011100 | 3 | 010011100 | 3 | 110011100 | 4 |
| 165 | 110011101 | 6 | 010011101 | 6 | 110011100 | 3 | 010011100 | 3 | 110011100 | 2 | 010011100 | 2 | 000011110 | 3 |
| 166 | 110011101 | 5 | 010011101 | 5 | 110011101 | 2 | 010011101 | 2 | 110011101 | 6 | 100011101 | 1 | 001000011 | 2 |
| 167 | 110011101 | 4 | 010011101 | 4 | 110011101 | 6 | 100011101 | 6 | 001000111 | 5 | 100011111 | 4 | 000100111 | 1 |
| 168 | 110011110 | 5 | 110011110 | 3 | 010011110 | 7 | 100011110 | 7 | 000100111 | 3 | 010010110 | 7 | 000011110 | 2 |
| 169 | 110011110 | 4 | 110011110 | 2 | 010011110 | 3 | 110011110 | 3 | 001000110 | 4 | 010010110 | 6 | 100011110 | 3 |
| 170 | 110011110 | 7 | 010011110 | 7 | 100011110 | 2 | 110011110 | 2 | 010001100 | 5 | 100000100 | 3 | 010100011 | 3 |
| 171 | 110100011 | 6 | 010100011 | 6 | 110011110 | 5 | 110011110 | 4 | 110011110 | 5 | 000100100 | 2 | 110100001 | 2 |
| 172 | 110100011 | 4 | 010100011 | 4 | 010100011 | 3 | 010100011 | 3 | 010101010 | 3 | 010010101 | 7 | 001000111 | 1 |
| 173 | 110100101 | 5 | 110100101 | 3 | 110100101 | 2 | 010100101 | 2 | 110101010 | 2 | 010010101 | 6 | 110100001 | 2 |
| 174 | 110100101 | 4 | 110100101 | 2 | 100100101 | 5 | 110101010 | 5 | 010101010 | 6 | 100100101 | 4 | 101101010 | 3 |
| 175 | 110100110 | 7 | 010100110 | 7 | 110100110 | 4 | 110100110 | 4 | 110101010 | 3 | 000101010 | 4 | 100101010 | 3 |
| 176 | 110100110 | 6 | 010100110 | 6 | 110100110 | 3 | 110100110 | 3 | 110101010 | 2 | 010010101 | 2 | 100100110 | 1 |
| 177 | 110100110 | 5 | 010100110 | 5 | 110100110 | 2 | 110100110 | 2 | 110101010 | 5 | 100101010 | 4 | 100100111 | 2 |
| 178 | 110100111 | 4 | 110100111 | 2 | 010101001 | 5 | 010101001 | 5 | 001001001 | 3 | 001001010 | 7 | 101101010 | 3 |
| 179 | 110101001 | 7 | 010101001 | 7 | 110101001 | 4 | 010101001 | 4 | 110101001 | 3 | 010101011 | 6 | 000100111 | 2 |
| 180 | 110101001 | 6 | 010101001 | 6 | 110101001 | 3 | 010101001 | 3 | 010101010 | 2 | 001001000 | 3 | 110101001 | 2 |
| 181 | 110101010 | 7 | 110101010 | 5 | 110101010 | 4 | 110101010 | 4 | 110101010 | 5 | 001101100 | 2 | 010101010 | 4 |
| 182 | 110101010 | 6 | 110101010 | 4 | 010101010 | 2 | 010101010 | 2 | 110101010 | 4 | 100010101 | 6 | 110101010 | 3 |
| 183 | 110101011 | 5 | 110101011 | 3 | 010101010 | 6 | 010101010 | 6 | 001001100 | 3 | 100010110 | 3 | 100101010 | 2 |
| 184 | 110101011 | 4 | 110101011 | 2 | 010101100 | 3 | 010101100 | 3 | 010101100 | 2 | 001101001 | 5 | 000101010 | 4 |
| 185 | 110101100 | 5 | 100101100 | 2 | 100101100 | 5 | 100101100 | 5 | 001001100 | 6 | 000101001 | 4 | 100101010 | 2 |
| 186 | 110101101 | 4 | 010101101 | 6 | 110101101 | 3 | 110101101 | 3 | 001000110 | 5 | 101001010 | 2 | 001000111 | 4 |
| 187 | 110101101 | 7 | 110101111 | 5 | 110101101 | 2 | 110101101 | 4 | 001000111 | 4 | 010000111 | 3 | 001000111 | 4 |
| 188 | 110101110 | 5 | 110101110 | 4 | 110000101 | 7 | 010000101 | 7 | 110000101 | 5 | 010000101 | 4 | 110000101 | 3 |

FIG. 2f

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 189 | 11010110 | 4 | 11010110 | 2 | 10010110 | 6 | 00010110 | 6 | 10010110 | 4 | 00010110 | 4 | 10010110 | 2 |
| 190 | 11011001 | 7 | 01011001 | 6 | 11011001 | 4 | 01011001 | 4 | 11011001 | 3 | 01011001 | 2 | 10100000 | 7 |
| 191 | 11011001 | 6 | 10011010 | 7 | 11011001 | 7 | 10011010 | 5 | 11011001 | 2 | 10001101 | 3 | 10001100 | 4 |
| 192 | 11011010 | 7 | 11011010 | 5 | 01011010 | 7 | 11011010 | 3 | 01011010 | 5 | 00110000 | 7 | 00110010 | 3 |
| 193 | 11011010 | 6 | 11011010 | 4 | 11011010 | 7 | 11011010 | 2 | 11011000 | 4 | 00110000 | 6 | 10011010 | 3 |
| 194 | 11011011 | 5 | 11011011 | 3 | 11011011 | 6 | 01011011 | 7 | 11010001 | 3 | 01011001 | 5 | 10011001 | 2 |
| 195 | 11011011 | 4 | 11011011 | 2 | 10011011 | 7 | 00011011 | 6 | 10011001 | 2 | 00110000 | 4 | 10110100 | 4 |
| 196 | 11011010 | 7 | 01011010 | 6 | 11011010 | 4 | 01011010 | 4 | 11010100 | 5 | 01011010 | 2 | 00101001 | 4 |
| 197 | 11011010 | 6 | 10011001 | 5 | 11010100 | 3 | 10011001 | 3 | 11010100 | 3 | 00001101 | 3 | 10001010 | 5 |
| 198 | 11011010 | 5 | 00011001 | 3 | 11010101 | 2 | 00011001 | 4 | 00010100 | 6 | 00001101 | 5 | 00010110 | 3 |
| 199 | 11011010 | 4 | 00011000 | 2 | 11010101 | 7 | 00011000 | 4 | 10000100 | 7 | 10000110 | 7 | 00011000 | 4 |
| 200 | 11011011 | 5 | 11011011 | 5 | 11010101 | 6 | 00011011 | 5 | 11000100 | 5 | 01010100 | 4 | 10110100 | 3 |
| 201 | 11011011 | 4 | 11011011 | 3 | 11010100 | 5 | 11011000 | 6 | 10001100 | 4 | 00001101 | 2 | 00010110 | 4 |
| 202 | 11011011 | 5 | 11011011 | 3 | 10010100 | 4 | 00011000 | 4 | 10011111 | 2 | 10100110 | 2 | 10010100 | 2 |
| 203 | 11011100 | 4 | 11011011 | 2 | 10111000 | 3 | 00011001 | 3 | 00010100 | 6 | 00001101 | 5 | 00010101 | 5 |
| 204 | 11011001 | 7 | 10011001 | 7 | 11011001 | 2 | 10011001 | 2 | 01010000 | 5 | 10001110 | 7 | 10011101 | 2 |
| 205 | 11011100 | 5 | 00011001 | 5 | 11011010 | 7 | 10011001 | 5 | 10010100 | 2 | 10100010 | 2 | 00100011 | 4 |
| 206 | 11011101 | 4 | 11011010 | 4 | 11011001 | 6 | 11011000 | 4 | 10010001 | 7 | 00001101 | 6 | 10100011 | 4 |
| 207 | 11011110 | 5 | 00011010 | 3 | 01011100 | 5 | 10011101 | 3 | 01010001 | 6 | 10000110 | 3 | 01010000 | 6 |
| 208 | 11011110 | 4 | 00011110 | 2 | 01011101 | 4 | 10011110 | 2 | 11100000 | 4 | 10001001 | 6 | 10100011 | 2 |
| 209 | 11000011 | 7 | 01111100 | 7 | 01111110 | 7 | 11111110 | 6 | 00100011 | 3 | 10001001 | 4 | 01000111 | 3 |
| 210 | 11000011 | 6 | 11000011 | 6 | 01111110 | 6 | 11111110 | 4 | 01110001 | 2 | 10001001 | 3 | 00100110 | 4 |
| 211 | 11000011 | 5 | 11000011 | 5 | 01110001 | 5 | 01111110 | 5 | 01111101 | 7 | 10010011 | 2 | 10010100 | 2 |
| 212 | 11000101 | 4 | 11000101 | 4 | 01110001 | 4 | 01110001 | 4 | 11101100 | 5 | 01110100 | 7 | 01010001 | 4 |
| 213 | 11000101 | 5 | 11000101 | 3 | 01110001 | 5 | 01110001 | 5 | 11110001 | 3 | 10001010 | 6 | 01010001 | 4 |
| 214 | 11000110 | 4 | 11000110 | 2 | 01110010 | 6 | 11110010 | 6 | 01110100 | 4 | 10000100 | 4 | 10010100 | 3 |
| 215 | 11000110 | 7 | 11000110 | 6 | 11010010 | 5 | 01110010 | 4 | 01110101 | 4 | 10010001 | 4 | 01100110 | 5 |
| 216 | 11000111 | 5 | 11000111 | 5 | 01010011 | 4 | 01010010 | 3 | 11010011 | 2 | 00001101 | 4 | 10001001 | 1 |
| 217 | 11001001 | 4 | 11001001 | 3 | 10110001 | 6 | 00110001 | 2 | 10110001 | 5 | 01101001 | 4 | 00010110 | 2 |
| 218 | 11001001 | 7 | 11001001 | 2 | 11110001 | 5 | 00110001 | 5 | 10110001 | 5 | 00000001 | 4 | 00010001 | 6 |
| 219 | 11001010 | 6 | 11001010 | 6 | 11110010 | 4 | 11110010 | 6 | 11110100 | 4 | 01010010 | 2 | 10101010 | 7 |
| 220 | 11001011 | 4 | 11001011 | 5 | 11110001 | 7 | 11110001 | 4 | 01110010 | 5 | 01010100 | 7 | 10101001 | 3 |
| 221 | 11001010 | 6 | 11001010 | 4 | 01110010 | 6 | 11110010 | 6 | 01110010 | 5 | 01010100 | 6 | 01010100 | 4 |
| 222 | 11001011 | 5 | 11001011 | 3 | 11010100 | 7 | 01010100 | 4 | 11010100 | 5 | 01010100 | 5 | 11010100 | 3 |

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 223 | 111001100 | 7 | 011001100 | 6 | 111001100 | 5 | 011001100 | 4 | 111001100 | 3 | 011001100 | 2 | 000100010 | 6 |
| 224 | 111001100 | 6 | 111001110 | 2 | 111001100 | 4 | 100000110 | 7 | 111001100 | 2 | 100000110 | 5 | 100000100 | 7 |
| 225 | 111001101 | 5 | 001011001 | 6 | 111001101 | 3 | 001011001 | 7 | 010000011 | 6 | 001011001 | 5 | 010100011 | 4 |
| 226 | 111001110 | 5 | 111001110 | 3 | 000101011 | 6 | 000101001 | 7 | 000101001 | 4 | 000101001 | 5 | 000101011 | 2 |
| 227 | 111010001 | 7 | 011010001 | 6 | 111010001 | 5 | 011010001 | 4 | 111010001 | 3 | 011010001 | 2 | 000100010 | 6 |
| 228 | 111010010 | 6 | 111010011 | 2 | 111010001 | 4 | 100001010 | 3 | 111010001 | 2 | 100001010 | 7 | 000010100 | 7 |
| 229 | 111010010 | 6 | 111010010 | 5 | 011010010 | 7 | 111010010 | 2 | 011010010 | 5 | 010010000 | 6 | 110010010 | 3 |
| 230 | 111010011 | 5 | 111010011 | 4 | 011010110 | 6 | 011010010 | 7 | 011010010 | 4 | 000010100 | 7 | 011010010 | 2 |
| 231 | 111010100 | 7 | 011010100 | 3 | 111010100 | 5 | 011010100 | 4 | 011010100 | 3 | 011010100 | 6 | 000100110 | 6 |
| 232 | 111010100 | 6 | 011010100 | 6 | 111010100 | 4 | 100010010 | 7 | 000101011 | 2 | 100010010 | 5 | 010010010 | 4 |
| 233 | 111010101 | 5 | 100001011 | 6 | 000100101 | 3 | 100001011 | 4 | 000001011 | 7 | 100001011 | 2 | 000010011 | 2 |
| 234 | 111010110 | 7 | 111010110 | 3 | 111010110 | 6 | 000100001 | 4 | 111010110 | 3 | 000100001 | 5 | 000110010 | 7 |
| 235 | 111011000 | 5 | 011011010 | 6 | 111011000 | 4 | 011011000 | 7 | 111011000 | 2 | 011011000 | 5 | 101011000 | 2 |
| 236 | 111011000 | 7 | 111011010 | 2 | 111011000 | 5 | 100100010 | 4 | 111011000 | 3 | 100100010 | 7 | 000100010 | 7 |
| 237 | 111011001 | 6 | 100001110 | 6 | 111011001 | 4 | 100001110 | 3 | 000001100 | 2 | 100001110 | 5 | 100001110 | 5 |
| 238 | 111011010 | 7 | 000101110 | 3 | 000111010 | 3 | 000101110 | 2 | 000101110 | 7 | 000101110 | 6 | 000110100 | 2 |
| 239 | 111011010 | 6 | 100100011 | 6 | 111011010 | 5 | 100100011 | 4 | 100100011 | 2 | 100100011 | 2 | 100100011 | 7 |
| 240 | 111011100 | 5 | 100011100 | 5 | 111011100 | 4 | 101011000 | 7 | 000001011 | 3 | 101011000 | 6 | 011001010 | 6 |
| 241 | 111100001 | 7 | 011100001 | 4 | 111100001 | 3 | 011100001 | 2 | 111100001 | 4 | 011100001 | 5 | 011100001 | 5 |
| 242 | 111100001 | 6 | 111100001 | 3 | 011100001 | 7 | 000011100 | 2 | 100100001 | 7 | 100000010 | 5 | 001100010 | 2 |
| 243 | 111100010 | 5 | 111100010 | 6 | 011100010 | 7 | 011100010 | 3 | 011100010 | 3 | 000111000 | 2 | 011100010 | 6 |
| 244 | 111100011 | 6 | 000111100 | 4 | 000111100 | 4 | 000111000 | 7 | 000111100 | 6 | 000011100 | 7 | 000011100 | 2 |
| 245 | 111100100 | 7 | 011100100 | 3 | 011100100 | 3 | 000001100 | 4 | 011100100 | 3 | 011100100 | 5 | 011000100 | 6 |
| 246 | 111100100 | 5 | 011100100 | 6 | 111100100 | 6 | 011100100 | 4 | 011100100 | 6 | 110011000 | 2 | 000011000 | 3 |
| 247 | 111100110 | 6 | 111100110 | 2 | 111100110 | 6 | 110000010 | 4 | 111100110 | 4 | 000010010 | 2 | 010000010 | 3 |
| 248 | 111100101 | 5 | 100010110 | 6 | 111100101 | 3 | 100010110 | 4 | 000010110 | 7 | 100010110 | 2 | 000010110 | 2 |
| 249 | 111101001 | 5 | 011100110 | 3 | 001010001 | 6 | 011101001 | 7 | 001010001 | 4 | 011101001 | 4 | 001010001 | 4 |
| 250 | 111101000 | 7 | 011101000 | 5 | 111101000 | 5 | 011101000 | 2 | 111101000 | 3 | 011101000 | 2 | 101100000 | 2 |
| 251 | 111101010 | 6 | 111101010 | 3 | 011001001 | 6 | 000101001 | 4 | 000101001 | 7 | 000101001 | 5 | 000011000 | 5 |
| 252 | 111101001 | 5 | 100011010 | 2 | 111101001 | 4 | 100011010 | 4 | 000011010 | 3 | 100011010 | 2 | 000011010 | 2 |
| 253 | 111101010 | 5 | 111101010 | 3 | 111101010 | 6 | 001001100 | 4 | 000100011 | 4 | 001001100 | 4 | 001001110 | 4 |
| 254 | 111101100 | 5 | 100100011 | 6 | 111101100 | 3 | 100100011 | 7 | 000100011 | 7 | 100100011 | 2 | 000100011 | 2 |
| 255 | 111110100 | 5 | 100100110 | 6 | 111110100 | 3 | 100100110 | 4 | 000100110 | 7 | 100100110 | 2 | 000100110 | 4 |

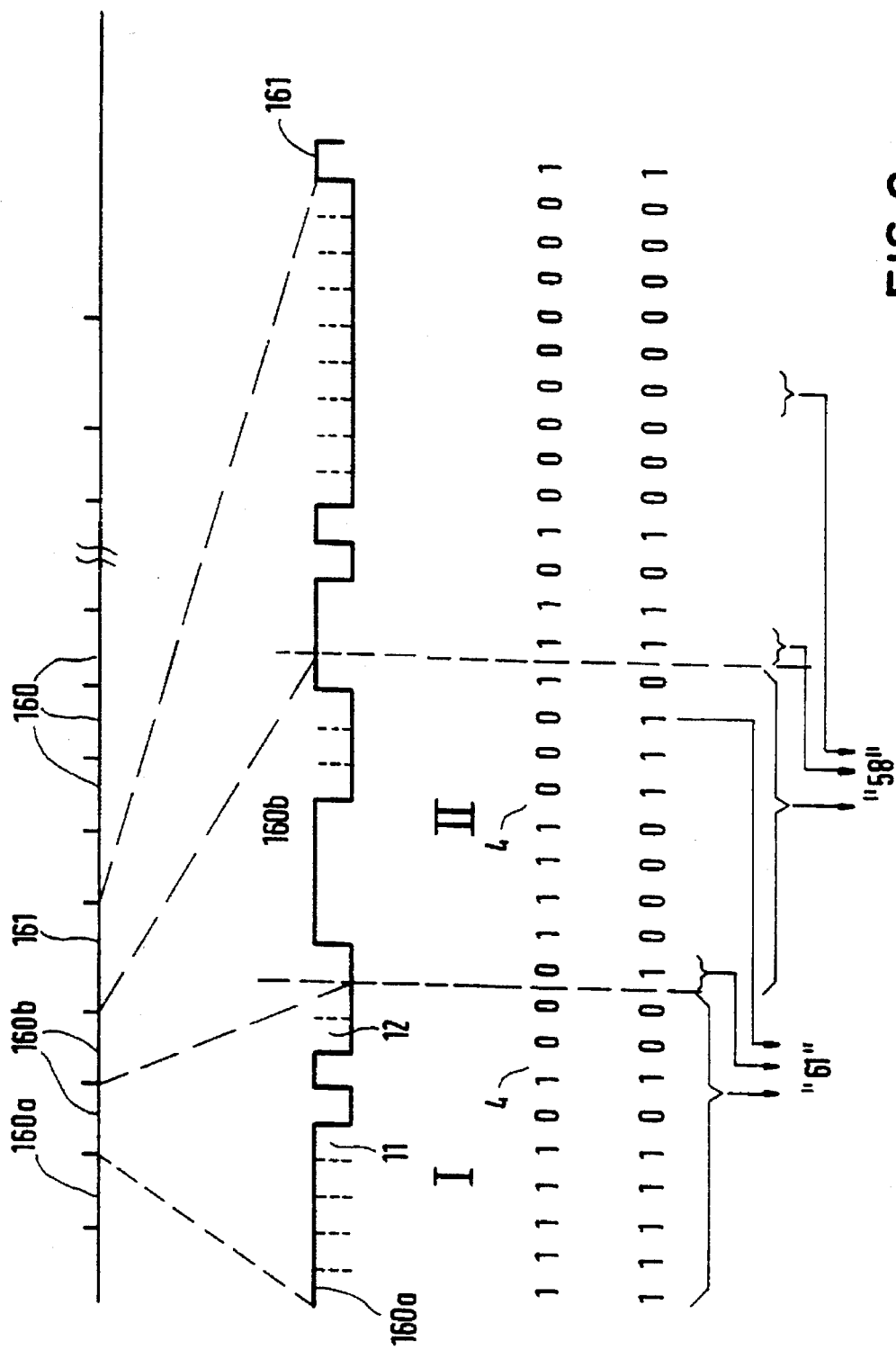

METHODS AND DEVICES FOR CONVERTING A SEQUENCE OF M-BIT INFORMATION WORDS TO A MODULATED SIGNAL AND INCLUDING THAT SIGNAL ON A RECORD CARRIER, DEVICES FOR DECODING THAT SIGNAL AND READING IT FROM A RECORD CARRIER, AND THAT SIGNAL

BACKGROUND OF THE INVENTION

The invention relates to a method, of converting a sequence of m-bit information words to a modulated binary signal, where m is an integer, in which method an n-bit code word is delivered for each received information word from the sequence, where n is an integer exceeding m, and the delivered code words are converted to the modulated signal. The modulated signal comprises bit cells having a first signal value and bit cells having a second signal value, and comprises for each of the delivered code words a corresponding signal portion. In accordance with the method, when one of the code words is assigned to one of the information words to be converted, that code word is selected from a set of code words, which set depends on a coding state determined after a code word has been delivered and which state is related to a digital sum value at the end of the modulated signal portion that corresponds to the delivered code word. The digital sum value denotes for a directly preceding portion of the modulated signal a running value of a difference between the number of bit cells having the first signal value and the number of bit cells having the second signal value.

The invention further relates to a method of producing a record carrier on which a modulated signal obtained according to the previous method is recorded.

The invention also relates to a coding device for converting a sequence of m-bit information words to a modulated binary signal, where m is an integer. Such a device comprises an m-to-n converter for converting each of the m-bit information words from the sequence to an n-bit code word, where n is an integer exceeding m, another converter for converting the code words converted by the m-to-n converter to the modulated signal, which signal comprises bit cells having a first signal value and bit cells having a second signal value, and comprises for each of the delivered code words a corresponding signal portion, and a determining unit for determining a coding state related to a digital sum value at the end of the modulated signal portion that corresponds to the delivered code word, which digital sum value denotes for a directly preceding modulated signal portion a running value of a difference between the number of bit cells having the first signal value and the number of bit cells having the second signal second value, wherein the m-to-n converter comprises a selection for selecting for the conversion a code word from a set of code words that depends on the coding state.

The invention further relates to a recording device in which such a coding device is used.

The invention still further relates to a signal comprising a sequence of q successive information signal portions which represent q information words, where q is an integer, in which signal each of the information signal portions comprises n bit cells which have a first or a second signal value, where each information signal portion belonging to a predefined group of information signal portions uniquely establishes an information word, and the number of successive bit cells having the same signal value is greater than or equal to 1 and smaller than or equal to k, where k is an integer. Each in information signal portion belonging to a second group of information signal portions with an adjacent information signal portion uniquely establishes an information word.

The invention further relates to a record carrier on which that signal is recorded.

The invention furthermore relates to a decoding device for converting that signal to a sequence of m-bit information words. The device comprises converter for converting the signal to a bit string of bits having a first or a second logical value, which bit string contains n-bit code words corresponding to the information signal portions, and another converter for converting the sequence of code words to the sequence of information words, where each of the code words to be converted is assigned an information word that depends on the code word to be convened.

Finally, the invention relates to a reading device in which a record carrier of this type is used.

Such methods, such devices, such a record carrier and such a signal are known from EP-A 0.150.082.

That document describes a modulation system in which a sequence of 8-bit information words is converted to a sequence of 10-bit code words. The 10-bit code words are converted to a modulated signal formed by bit cells having a first or a second signal value. Each bit cell represents a bit from the 10-bit code word sequence, where the logical value of the bit is denoted by the signal value of the bit cell. On conversion, each time a 10-bit code word is delivered, a digital sum value is computed for the code words already delivered. This digital sum value denotes the difference between the number of "0" bits and the number of "1" bits for the delivered part of the code word sequence.

The code word to be delivered is selected from a set of code words that depends on the computed digital sum value. The code words in the set are selected in such a way that the digital sum value remains within a small range, which leads to the fact that the frequency spectrum of the signal does not contain frequency components in the low-frequency area. Such a signal is also referenced a DC-free signal or DC-balanced signal. The lack of low-frequency components in the signal generally has great advantages for information transfer via a record carrier or other transmission channel.

In information recording there is always a need for increasing the information density on the record carrier.

A possible solution is a reduction of the number of bit cells in the modulated signal for each information word.

The problem with this is that as a result of the reduction of the number of bit cells for each information word, the number of unique bit combinations by which the information words can be represented diminishes, meaning in that less stringent restrictions can be made on the modulated signal, for example, restrictions relating to low-frequency contents of the modulated signal.

SUMMARY OF THE INVENTION

It is an object of the invention to provide means which make a reduction of the number of bit cells for each information word possible, but by which the loss of the number of unique bit combinations is counteracted.

According to a first aspect of the invention, this object is achieved with a method as defined in the opening paragraph, characterized in that at least one of the digital sum values determines a first or a second coding state of a pair of coding states of a first type, the first or second coding state of the pair being determined in response to the information word that corresponds to the previously delivered code word. The code word sets belonging to each pair of coding states of the first type do not contain any code word in common.

According to a second aspect of the invention a coding device in accordance with the one described above and the invention is characterized in that the determining unit is arranged to determine at least for a number of digital sum values a first or a second coding state of a pair of coding states of a first type. The determining unit comprising a unit for determining the first or second coding state of the pair in response to the information word that corresponds to the previously delivered code word. The sets of code words belonging to each pair of coding states of the first type do not contain any code word in common.

In the method and coding device according to the invention, the combination of a same code word with code words from disjunct codeword sets (i.e., codeword sets without common code words) establishes different unique bit combinations, so that the same code word combined with its successor can uniquely represent more than one information word. A code word from the group of the first type is always followed by a code word of which it can always be uniquely defined to what code word set this code word belongs. With the code words from each of the disjunct sets, it is possible to establish sufficient unique bit combinations to represent all the information words. This means that the number of bit cells for each information word is equal to the number of bits for each code word.

These measures make it possible to establish a large number of unique bit combinations with code words having a relatively small number of bits for each code word.

A further embodiment is characterized in that synchronization (sync) words are inserted into the code word sequence. The sync words show bit patterns that cannot occur in the bit string formed by the code words. The sync words which are used have different bit patterns, and each sync word used depends on the coding state, i.e., once a sync word has been inserted, a predefined coding state is determined for the conversion of the next information word. The sync words are mutually distinguishable based upon the logical values of bits at predefined bit positions in a manner that corresponds to the manner in which the sets of code words belonging to the coding states of the second type are mutually distinguishable.

This embodiment has the advantage that in the case where a code word from the group of the second type is followed by a sync word, an information word is established by a bit combination formed by the code word and the sync word in the same way as in the case where the code word from the group of the second type would be followed by a code word.

A further embodiment of the method is characterized in that n is odd and the code words in the sets related to even sum values are the inverse of the code words in the sets related to odd sum values.

Because the number of bits for each code word is even, the digital sum value at the end of the code words will alternately assume an even or an odd value. Since the code words abandoning an even digital sum value and assuming an odd sum value are inverse to the code words in which this odd sum value is abandoned and the even sum value is returned to, it is possible to select, when even digital sum values are concerned, code words which are the inverse of the code words belonging to odd digital sum values.

In that case, code words need to be generated only for the even (or odd) digital sum values. The code words to be generated for the odd (or even) sum values may be simply obtained by inverting the code words belonging to the even (or odd) digital sum values.

In the method according to the invention m is preferably selected to be equal to 8 and n equal to 9.

Preferably, the number of different digital sum values to which a coding state is related is equal to 8, where the two extreme values of the 8 different digital sum values are each related to a coding state of the second type, and the remaining values of the 8 different sum values are each related each to two coding states of the first type. With these values for the parameters, the number of possible unique combinations is adequate to allow the digital sum value can still remain restricted to within a small range.

With these parameters, a minimum variation of the digital sum value is obtained if the sets of code words contain only those code words for which the digital sum value between the ends of the signal portions corresponding to the code words continues to be in a range of 10 different values.

With the method according to the invention, a DC-free modulated signal having a very small number of code word bits for each information word bit can be obtained for the case where the number of bits m for each information word is selected equal to 8 and the number of bits n for each code word is selected equal to 9.

The signal obtained by the coding device according to the invention is advantageous in that it can be decoded in an extremely simple manner.

An embodiment for a decoding device in accordance with the one described above and the invention by which this is realised is characterized in that the converter is arranged for assigning the information word in dependence on the logical values of the bits in the bit string which are situated at p predefined positions with respect to the corresponding code word.

A further embodiment for the decoding device is characterized in that the converter comprises an inverter means for inverting a code word to be converted before it is converted, and a unit for activating or not activating the inverter in response to a decoding state.

The complexity of the conversion of code words to information words is simplified considerably by the use of the inverter means.

BRIEF DESCRIPTION OF THE DRAWINGS

The invention will be further explained with reference to the drawing, in which:

FIGS. 2a–h show Tables in which the relation between the information words and the code words is laid down;

FIG. 6 shows portions of a modulated signal and the corresponding code words;

DESCRIPTION OF THE PREFERRED EMBODIMENTS

Figure 1:
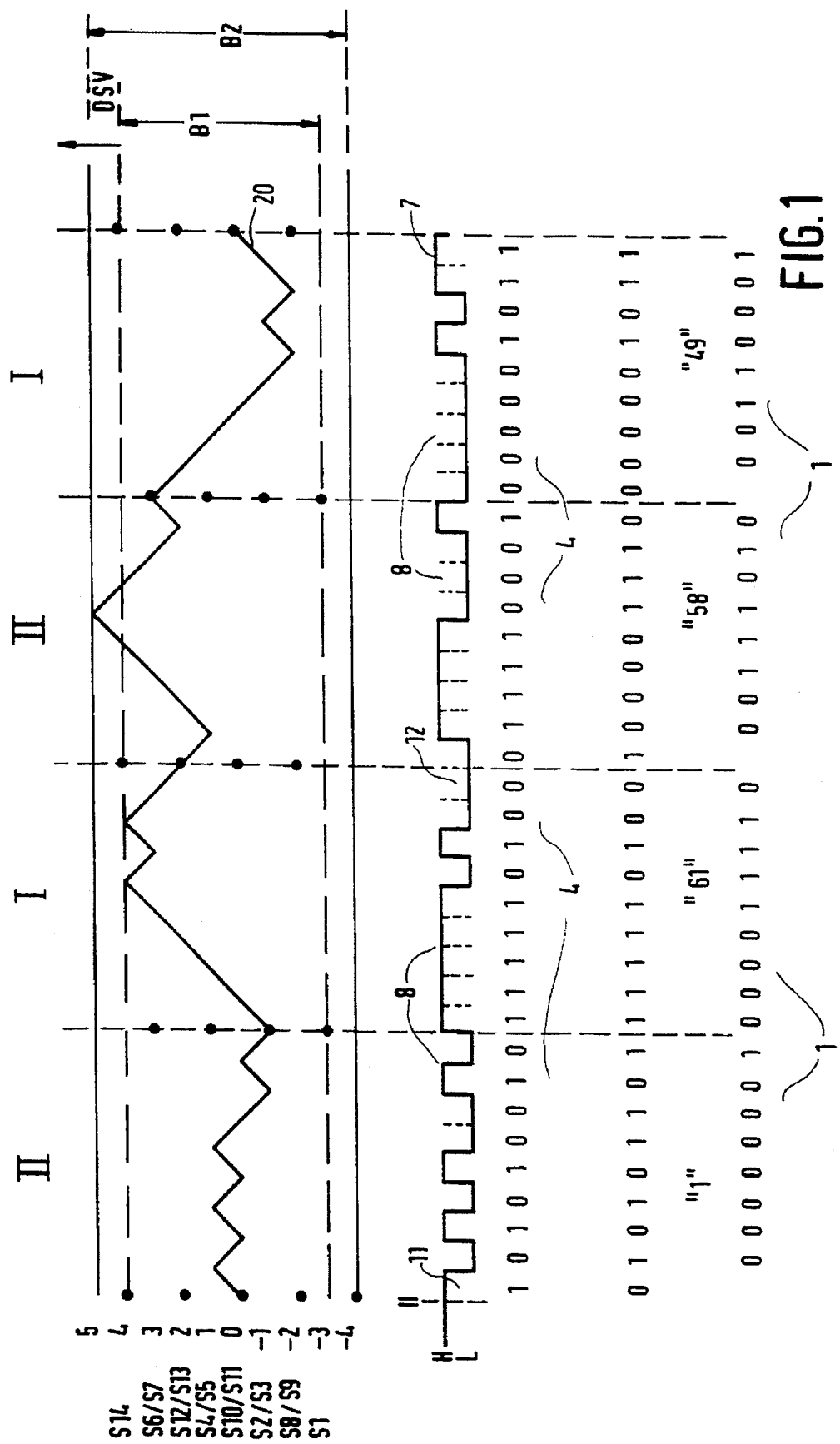
FIG. 1 shows a sequence of information words, a corresponding sequence of code words and a modulated signal.

FIG. 1 shows four successive m-bit information words, in this case 8-bit information words referenced 1. The four information words 1 have the respective word values "1", "61", "58" and "49". This sequence of four information words 1 is converted to four successive n-bit code words, in this case 9-bit code words referenced 4. The code words 4 form a bit string of bits having a logical "0" value and bits having a logical "1" value. The conversion of the information words is such that in the bit string the number of successive bits having the same logical value is equal to 9 at the most. The individual bits of the code words will be referenced $x1, \ldots, x9$ hereinafter, where $x1$ indicates the first bit (from the left) of the code word and $x9$ indicates the last bit of the code word.

The bit string formed by the code words 4 is converted to a modulated signal 7. This modulated signal 7 contains four information signal portions 8 each representing one of the code words 4. The information signal portions 8 contain bit cells 11 which have a high signal value H and bit cells 12 which have a low signal value L. The number of bit cells for each information signal portion 8 is equal to the number of bits of the corresponding code word 4. Each code word bit having a logical "1" value is indicated in the modulated signal 7 by one of the bit cells 11 having the high signal value H. Each code word bit having the logical "0" value is indicated in the modulated signal 7 by one of the bit cells 12 having the low signal value L.

Furthermore, that the running digital sum value of the modulated signal 7 is required to vary only within a limited range B2, which means that the frequency spectrum of the modulated signal 7 comprises substantially no low-frequency components. Worded differently, the modulated signal 7 is DC-free.

The digital sum value as used herein is the difference between the number of preceding bit cells having a high signal value and the number of preceding bit cells having a low signal value. Worded differently, the digital sum value corresponds to the integrated value of the modulated signal.

FIG. 1 shows the variation of the digital sum value in curve 20. In FIG. 1 the range B2 in which the digital sum value varies lies between −4 and +5. The number of bit cells having the same signal value is at most equal to the distance between the boundaries of this range, in this example this is 9.

In the embodiment described, the number of different values the digital sum value can assume at the ends of the signal portions 8 is equal to 8. These values lie in a range B1 bounded by the values −3 and +4.

The number of bits of the code words is odd, which means that the digital sum value at the ends of the signal portions 8 will be alternately odd and even. The code words in which the digital sum value at the beginning is even will be referenced even code words hereinafter. The code words in which the digital sum value at the beginning is odd will be referenced odd code words hereinafter. Periods of time in which an even code word is delivered will be referenced even periods II, and periods of time in which an odd code word is delivered will be referenced odd periods I.

A detailed description of an embodiment for a method according to the invention by which the modulated signal 7 can be obtained will be described hereinafter.

Either one of the two digital sum values "−3" and "+4" at the end of each information potion determines a coding state of a second type. In the embodiment described the digital sum value "−3" determines the coding state S1 and the digital sum value "+4" the coding state S14. Each of the digital sum values "−2", "−1", "0", "1", "2", "3", together with the information word to be converted, determines a coding state of a first type. Depending on the information word to be converted, the coding state S8 or S9 is determined by the digital sum value "−2", the coding state S2 or S3 is determined by the digital sum value "−1", the coding state S10 or S11 is determined by the digital sum value "0", the coding state S4 or S5 is determined by the digital sum value "1", the coding state S12 or S13 is determined by the digital sum value "2", and the coding state S6 or S7 is determined by the digital sum value "3".

In the matrix T below, each element $t_{ij}$ denotes the number of different code words with which it is possible to abandon state i and enter state j.

| 0 | 0 | 0 | 0 | 0 | 0 | 0 | 90 | 90 | 75 | 75 | 35 | 35 | 9 |
|---|---|---|---|---|---|---|----|----|----|----|----|----|---|
| 0 | 0 | 0 | 0 | 0 | 0 | 0 | 54 | 54 | 56 | 56 | 42 | 42 | 22 |
| 0 | 0 | 0 | 0 | 0 | 0 | 0 | 63 | 63 | 69 | 69 | 42 | 42 | 13 |
| 0 | 0 | 0 | 0 | 0 | 0 | 0 | 42 | 42 | 56 | 56 | 56 | 56 | 40 |
| 0 | 0 | 0 | 0 | 0 | 0 | 0 | 41 | 41 | 70 | 70 | 69 | 69 | 35 |
| 0 | 0 | 0 | 0 | 0 | 0 | 0 | 22 | 22 | 42 | 42 | 54 | 54 | 42 |
| 0 | 0 | 0 | 0 | 0 | 0 | 0 | 14 | 14 | 41 | 41 | 63 | 63 | 48 |
| 48 | 63 | 63 | 41 | 41 | 14 | 14 | 0 | 0 | 0 | 0 | 0 | 0 | 0 |
| 42 | 54 | 54 | 42 | 42 | 22 | 22 | 0 | 0 | 0 | 0 | 0 | 0 | 0 |
| 35 | 69 | 69 | 70 | 70 | 41 | 41 | 0 | 0 | 0 | 0 | 0 | 0 | 0 |
| 40 | 56 | 56 | 56 | 56 | 42 | 42 | 0 | 0 | 0 | 0 | 0 | 0 | 0 |
| 13 | 42 | 42 | 69 | 69 | 63 | 63 | 0 | 0 | 0 | 0 | 0 | 0 | 0 |
| 22 | 42 | 42 | 56 | 56 | 54 | 54 | 0 | 0 | 0 | 0 | 0 | 0 | 0 |
| 9 | 35 | 35 | 75 | 75 | 90 | 90 | 0 | 0 | 0 | 0 | 0 | 0 | 0 |

Starting from an even digital sum value, an odd sum value is always reached and vice versa. The elements in the matrix denoting transitions from an even digital sum value to another even sum value and transitions from an odd sum value to another odd sum value are therefore all equal to "0". The matrix is also symmetrical. This is due to the case where a code word changes a computed first digital sum value into a computed second digital sum value, the second digital sum value is changed into the first digital sum value by the inverse of the code word concerned.

To each of the coding states $S1, \ldots S14$ is assigned a set $V1, \ldots, V14$ of code words, which contains a code word for each possible information word. In the ease where the number of bits for each information word is equal to 8, each set thus contains 256 code words.

Furthermore, the sets of code words are selected such that the sets of code words established by the second coding states of the first type which belong to the same digital sum value, are disjunct. In other words, these sets have no code words whatsoever in common. In the embodiment shown, V2 and V3, V4 and V5, V6 and V7, V8 and V9, V10 and V11, V12 and V13 are pairs of disjunct sets.

The digital sum value "−1" always causes a code word from the set V2 or a code word from the set V3 to be assigned to the next information word to be converted. This means that during the information word conversion each of the code words leading to a digital sum value "−1" can be used twice. This code word (leading to the digital sum value "−1"), together with a random code word from the set V2, forms a bit combination that can be distinguished from the bit combination formed by the same code word and the random code word from the set V3. In similar fashion, each of the code words resulting in one of the digital sum values "+1", "+3", "−2", "0", "+2" and "+4" can be used twice for forming uniquely, together with the next word, two different information words.

All of this means that the number of unique bit combinations is increased considerably, compared to coding systems in which each code word per se is to define an information word in a unique manner.

Since for a code word that changes the digital sum value from a first value to a second value always the inverse code word value changes the digital sum value back from the second value to the first value, a set of code words can be assigned to one-half of the number of coding states, for example, the coding states belonging to a set of coding states determined by an odd digital sum value. The code words for the coding states determined by the even digital sum values may then be obtained by inverting the code words from the sets that belong to the coding states determined by the odd digital sum values. In the embodiment described herein, the code words belonging to the coding state $S_i$ are the inverse of the code words belonging to the state $S_{15-i}$, where i is an integer greater than or equal to 1 and smaller than or equal to 14.

By way of illustration FIGS. 2a–h show in the first column the word values WW of all of the 256 different 8-bit information words. The dedicated sets V1, V2, V3, V4, V5, V6 and V7 are shown in the respective second, fourth, sixth, eighth, tenth, twelfth and fourteenth columns.

The relations between the information words and code words in FIGS. 2a–h show are selected such that in the case where the same code word occurs in two or more of the sets V1, V2, V3, V4, V5, V6 and V7, this code word, combined with the next code word, as required, always establishes the same information word. This is advantageous in that on the recovery of the information words the corresponding coding states need not be determined, which results in little error propagation on the recovery of the information words. The disjunct sets belonging to the digital sum value can be distinguished in FIGS. 2a–h show on the basis of the bits x1 and x8 of the code words. In the code words in the sets belonging to the coding states S3, S5, S7, the logical values of bit x1 and bit x8 are not the same, whereas in the disjunct sets established by the corresponding coding states S2, S4 and S6, the bits x1 and x8 have the same logical value.

The digital sum value at the beginning of the code word uniquely determines the digital sum value at the end of the code word. The digital sum value at the end of this code word, combined with the convened information word, determines the coding state which is established at the end of the code word concerned. These coding states Sx which are determined at the end of each of the code words from the sets V1, V2, V3, V4, V5, V6 and V7 are shown in the respective third, fifth, seventh, ninth, eleventh, thirteenth and fifteenth columns, respectively of FIGS. 2a–h.

The sets V14, V13, V12, V11, V10, V9 and V8 can be derived by a code word inversion from the code words of the sets V1, V2, V3, V4, V5, V6 and V7, respectively. The coding states at the end of the code words from the sets V14, V13, V12, V11, V10, V9 and V8 (i>7) can be obtained in accordance with the relation $S_{in}=S_{15-i}$, where in is the coding state shown in the third, fifth, seventh, ninth, eleventh, thirteenth and fifteenth columns.

The conversion of the sequence of information words 1 to the sequence of code words 4 as shown in FIGS. 2a–h is obtained by means of the Tables shown in FIG. 2. At the instant at which the first information word (word value "1") of FIG. 1 is to be converted, the digital sum value is equal to "0". This means that the code word is to be selected from the set V10 or V11, depending on the information word belonging to the previous code word. Assuming that this information word, together with the digital sum value "0", determines the coding state S11, the code word is to be selected from set V11. Based upon the Tables shown in FIGS. 2a–h, the desired code word may be obtained by inversion of the code word "010101101" which is assigned to the information word having the word value "1" in the set V4 ($S_{in}$)=$S_{15-11}$)=$S_4$). The code word thus obtained is then equal to "101010010". The coding state at the end of the code word is then S3. This means that the range dedicated code word is to be selected from set V3. The next information word of FIG. 1 to be converted has the word value "61", which means that the next code word is equal to "111110100". The next coding state is equal to $S_{13}$. This means that the next code word is the inverse of the code word assigned to the next information word in the set V2 ($S_{15}-S_{13}$). The word FIG. 1 to be connected value of the next information word is "58". The dedicated code word in the set V2 is "100001110". The information word is convened to the inverse of this code word and thus to "011110001". The next coding state then becomes equal to S7. The code word of FIG. 1 for the next information word to be convened is thus to be selected from the set V7. This information word has the word value "49", so that the dedicated code word is equal to "000001011".

Figure 3:
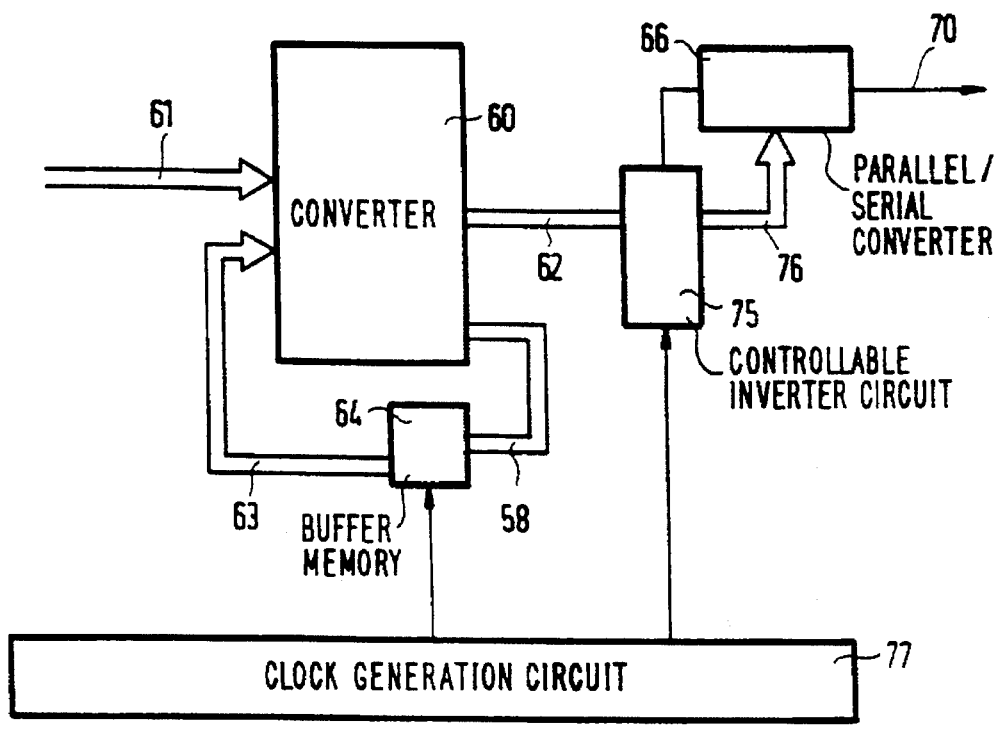
FIG. 3 shows an embodiment for a coding device according to the invention.

FIG. 3 shows an embodiment for a coding device 140 according to the invention by which the method described above can be implemented. The coding device is arranged for converting the n-bit information words 1 to the m-bit code words 4, while the number of different coding states being denoted by s bits. The coding device comprises a converter 60 for converting (m+s) binary input signals to (n+s) binary output signals. From the inputs of the converter m inputs are connected to a bus 61 for receiving m-bit information words. From the outputs of the converter 60 n outputs are connected to a bus 62 for supplying n-bit code words. Furthermore, s inputs are connected to an s-bit bus 63 for receiving a state word denoting the current coding state. The state word is produced by a buffer memory 64, for example, in the form of s-flip flops. The buffer memory 64 has s inputs connected to a bus 58 for receiving a state word to be loaded in the buffer memory 64. For transporting the state word to be loaded in the buffer memory 64, s outputs of the converter 60 are used which are connected to the bus 58.

The bus 62 is connected to a controllable inverter circuit 75 of a customary type which, in response to a control signal on its input, inverts or does not invert the n-bit code words received over bus 62 and conveys them to a bus 76. The bus 76 is connected to parallel inputs of a parallel/serial converter 66. The parallel/serial converter 66 converts the n-bit code words received over bus 76 to the modulated signal 7 supplied over a signal line 70.

The converter 60 may comprise a ROM memory (not shown) which stores the code word sets shown in FIG. 2a–h in the form of so-called look-up Tables at addresses established by the combination of state word and information word applied to the inputs of converter 60.

The converter 60 may comprise, in lieu of a ROM memory, a combinatorial logical circuit formed by gate circuits.

The synchronization of the operations performed in the coding device 140 may be obtained in customary fashion with synchronized clock signals which may be derived by a clock generation circuit 77. The clock generation circuit 77 causes, by applying the control signal to the inverter circuit 75, the code words delivered by the converter 60 for the even periods II to be inverted by the inverter circuit 75 and the code words delivered by the converter 60 for the odd periods I to be delivered unchanged by the converter 60.

In the embodiment shown the new coding state is directly delivered by the converter 60. In principle, however, it is alternatively possible that the new coding state can be derived by computing the digital sum value at the end of each delivered code word and deriving the new coding state based upon the digital sum value thus computed. In that, the coding device 140 also comprises a unit for computing the digital sum values as well as a unit which applies a corresponding state word to the buffer memory 64 based upon the computed digital sum value.

Preferably, the modulated signal 7 should comprise sync signal portions which have a signal pattern that cannot occur in a random sequence of information signal portions. Equally preferably, parts of the sync signal portions together with a part of an adjacent information signal portion, cannot form a signal pattern that corresponds to the pattern of the sync signal portions. The sync words may be inserted into the sequence of n-bit code words. The Table below shows seven 14-bit sync words which are preeminently suitable for use in combination with the code words shown in FIGS. 2a–h.

| 1 | 01011111111100 | 6 |
| 2 | 10001111111100 | 6 |
| 3 | 00011111111100 | 6 |
| 4 | 01111000000001 | 1 |
| 5 | 11110000000001 | 1 |
| 6 | 01110000000001 | 1 |
| 7 | 11010000000001 | 1 |

The first column of the Table shows coding states. The second column in the Table shows the sync words dedicated to this coding state. The third column shows the coding state adopted after the sync word has been delivered. In the case where the number of bits situated between the initial positions of successive sync words is even, sync words are not necessary for the coding states S8 to S14, because these coding states do not occur then. In that case, it is preferred to select the distance between the sync words so that an even number of bits is situated between the initial positions of the sync words.

The sync words delivered at the coding states S2, S4, S6 can be distinguished on the basis of the bits x1 and x8 from the sync words delivered at the coding states S3, S5 and S6 in the same way as the code words coming after these coding states can be distinguished. At the coding states S2, S4 and S6, a sync word is delivered for which the logical value of the bits x1 and x8 is the same. In the sync words delivered at the coding states S3, S5 and S7, the logical value of the bits x1 and x8 is not the same.

Figure 4:
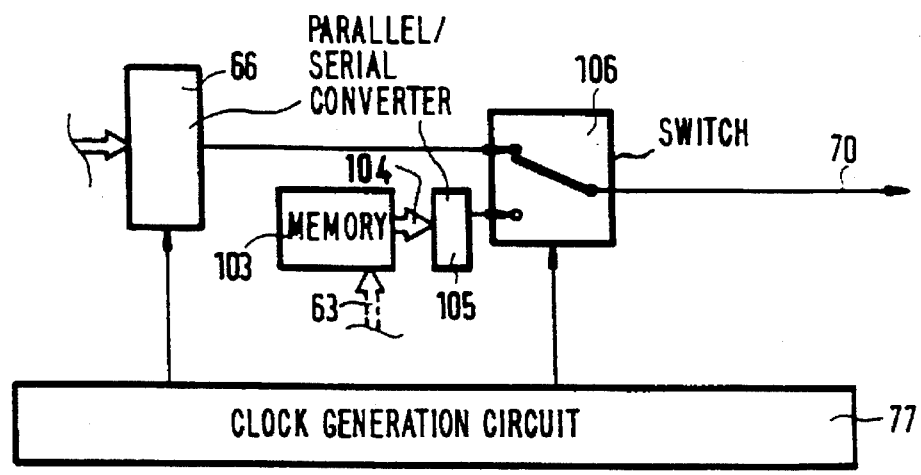
FIG. 4 shows a modification of the coding device of FIG. 3 for inserting sync signals.

FIG. 4 shows a modification of the coding device shown in FIG. 3, by which sync words can be inserted in the manner described above. In FIG. 4 the components identical with the components shown in FIG. 6 have like reference characters. The modification relates to a memory 103 having seven memory locations which each accommodate one of the seven sync words from the Table. The memory 103 comprises an addressing circuit for addressing one of the seven memory locations in response to the state word received over bus 63 on address inputs of the memory 103. The sync word in the addressed memory location is applied to a parallel/serial converter 105 over a bus 104. The serial output of the converter 105 is applied to a first input of an electronically operable switch unit 106. The serial output of the parallel/serial converter 66 is connected to a second input of the switch unit 106. The coding device 140 is again controlled by the control circuit 77 adapted for this purpose to alternately bring the coding device 140 into a first and a second state. In the first state a predefined, preferably even, number of information words is converted to code words which are serially applied to the signal line 70 via the switch unit 106. At the transition from the first to the second state, the conversion of information words is interrupted and the sync word established by the state word is delivered by the memory 103 and applied to the signal line 70 via the parallel/serial converter 104 and switch unit 106. In addition, at the transition from the second to the first state, the buffer memory is loaded, under the control of the control circuit 77, with the new coding state determined by the delivered sync word, after which the conversion from information words to code words is resumed until the coding device is again brought to the second state by the control circuit 77.

Figure 5:
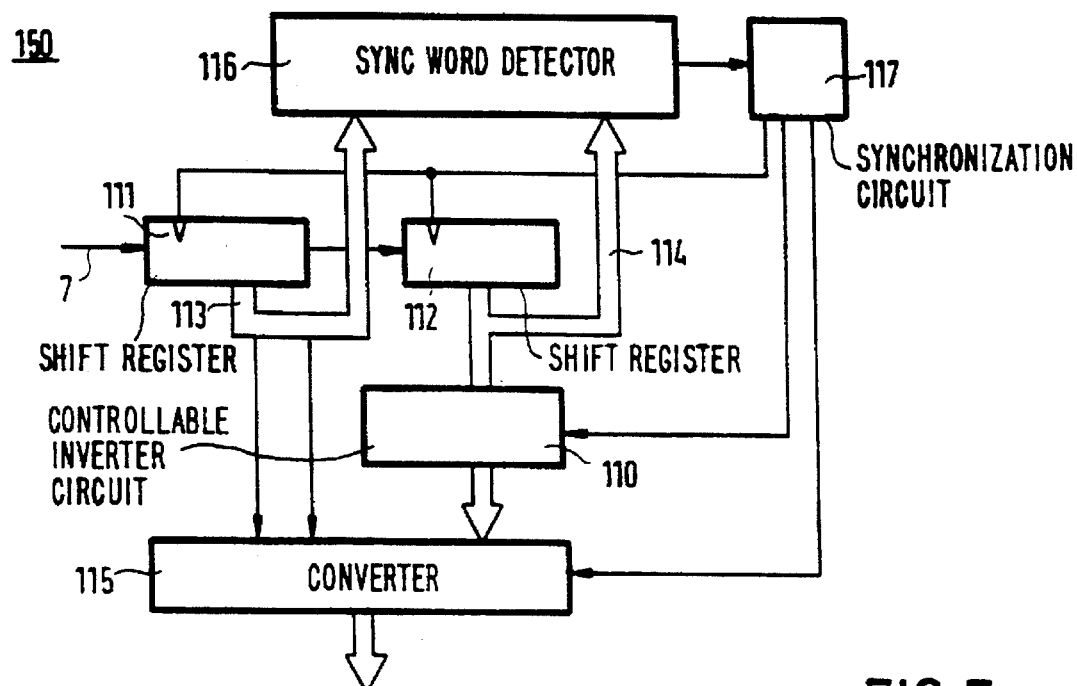
FIG. 5 shows a decoding device in accordance with the invention.

FIG. 5 shows an embodiment for a decoding device 150 according to the invention, for reconverting the modulated signals obtained by the implementation of the methods described above to a sequence of information words. The decoding circuit 150 comprises two series-arranged shift registers 111 and 112 to which the modulated signal 7 is applied. Each of the shift registers 111 and 112 has a length corresponding to the length of an n-bit code word. The contents of the shift registers 111 and 112 are fed to respective buses 113 and 114 through parallel outputs. The decoding device comprises an (n+p)-to-m-bit converter 115. All of the n bits available in the shift register 112 are applied to inputs of the converter 115 via the bus 114 and a controllable inverter circuit 110. From the n bits available in the shift register 111, p bits thereof, e.g., bits x1 and x8, together with the n bits from the shift register 112 uniquely establish an information word slipped by the converter 115. The converter 115 may comprise a memory with a look-up Table that contains an m-bit information word for each permitted bit combination formed by the n bits of an n-bit code word and the predefined p bits of a bit string portion following this code word. The converter 115 may also be formed by gate circuits, however. Because the controllable inverter circuit 110 is inserted between the outputs of register 112 and the inputs of the converter 115, the converter only needs to be capable of processing code words from the sets V1 to V7. For that matter, the code words in the odd periods I are inverse to the code words in the even periods II. Accordingly the decoding device 150 comprises means for alternately activating (in the even periods) and deactivating (in the odd periods) the inverter circuit 110. The inverter circuit 110 is of a customary type which, in deactivated state, transfers the code words received on its input unmodified to the converter 115. In active state the inverter circuit 110 transfers the received code words in inverse form to the converter.

The control of the inverter circuit 110 and the conversions carded out by the converter 115 may be synchronized in a customary manner by a synchronizing circuit 117, so that each time a code word as a whole is loaded in the shift register 112, the information word corresponding to the bit combination applied to the inputs of the converter 115 is available on the outputs of the converter 115.

Preferably, a sync word detector 116, connected to the buses 113 for 114 and detecting the bit patterns corresponding to the sync words is used during the synchronization process.

By way of illustration, FIG. 6 shows a signal which can be obtained with the invented method described above. The signal comprises a sequence of q successive information signal portions 160, where q is an integer, which portions represent q information words. Sync signal portions, of which FIG. 6 shows one, referenced 161, are inserted between the information signal portions. A plurality of information signal portions 160 are shown in detail. Each of the information signal portions 160 contains n bit cells, in this case 9, which have a first (low) signal value L or a second (high) signal value H. The number of successive bit cells having the same signal value is equal to at the least 1 and equal to at the most 9. Due to the digital sum value-dependent selection of the code words, the running value of the difference between the number of bit cells having the first signal value and the bit cells having the second signal value at a random point in the signal is substantially constant in the signal portion preceding this point. Each information signal portion 160 resulting in either of the digital sum values "-3" or "4", uniquely establishes an information word. Each information signal portion representing a code word which results in one of the digital sum values "-2" to "3", together with an adjacent signal portion, uniquely establishes an information word.

In FIG. 6, for example, the information signal portions 160a and 160b, together with the bit cells on the first and eighth positions of a next signal portion, establish the information words having the word values "61" and "58".

Figure 7:
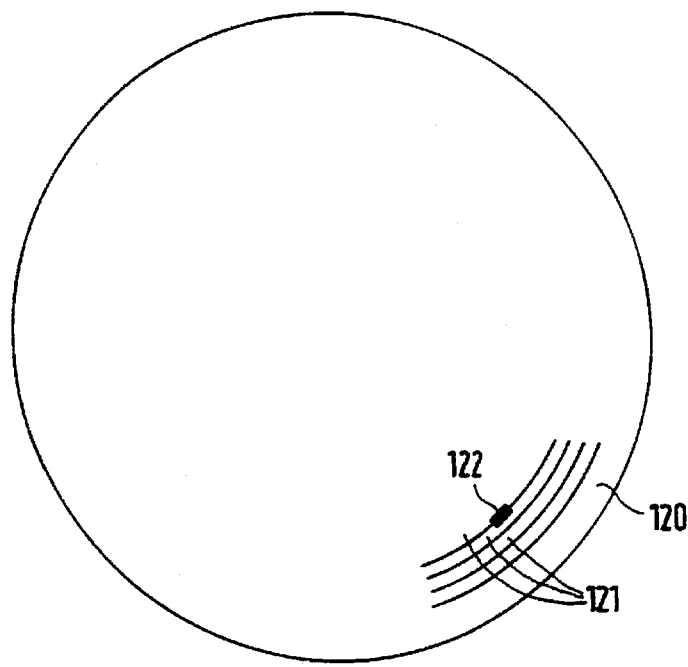
FIG. 7 shows a record carrier in accordance with the invention.

FIG. 7 shows, by way of example, a record carrier 120 according to the invention. The record carrier shown is one of an optically detectable type. The record carrier may, however, also be of a different type, for example, a magnetically detectable magnetic tape carrying an information pattern in the form of magnetic domains which have different directions of magnetization. The record carrier shown is disc-shaped. However, the invention may also be applied to tape-like record carriers.

Figure 8:
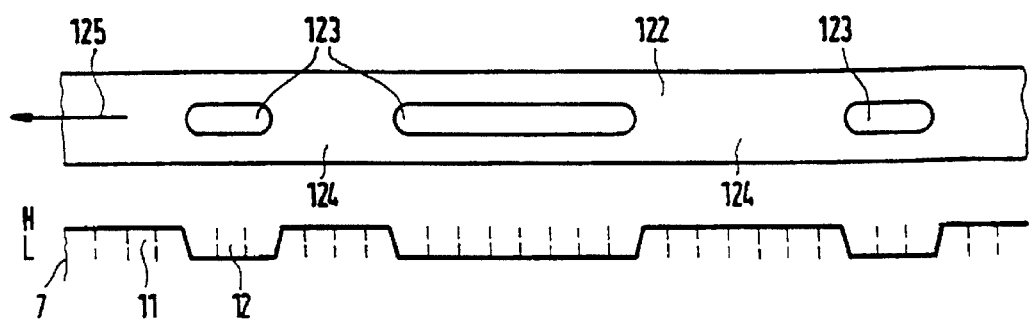
FIG. 8 shows a considerably enlarged part of the record carrier shown in FIG. 7.

The disc-shaped record carrier 120 contains information patterns arranged in tracks 121. FIG. 8 shows an enlarged part 122 of one of the tracks 121. The information pattern in the part of the track 121 shown in FIG. 8 comprises first parts 123, for example, in the form of optically detectable marks, and second parts 124, for example, lands situated in-between the marks. The first and second parts are alternating seen in the direction of the track 125. The first parts 123 present first detectable properties and the second parts 124 present second properties distinguishable from the first detectable properties. The first parts 123 represent bit cells 12 of the modulated binary signal 7 having one signal level, for example, the low signal level L. The second parts 124 represent bit cells 11 having the other signal level, for example, the high signal level H. The record carrier may be obtained by first generating the modulated signal and then having the record carrier carry the information pattern. If the record carrier is one of an optically detectable type, the record carrier may be obtained with mastering and replica techniques known pere se based upon the modulated signal 7.

Figure 9:
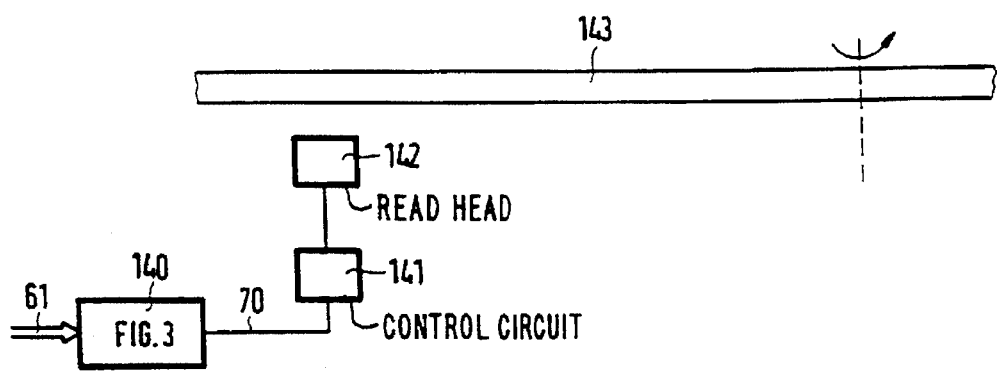
FIG. 9 shows a recording device in accordance with the invention.

FIG. 9 shows a recording device for information recording, in which a coding device according to the invention is used, for example, the coding device 140 shown in FIG. 3. In the recording device the signal line 70 delivers the modulated signal 7 to a control circuit 141 for a read head 142. The write head 142 is of a customary type which is capable of writing marks having detectable modifications on a record carrier 143 of an inscribable type as it is moved. The control circuit 141 may likewise be of a customary type generating a control signal for the write head 142 in response to the modulated signal 7 applied to the control circuit 141, so that the write head 142 produces a pattern of marks corresponding to the modulated signal 7 on the record carrier 143.

Figure 10:
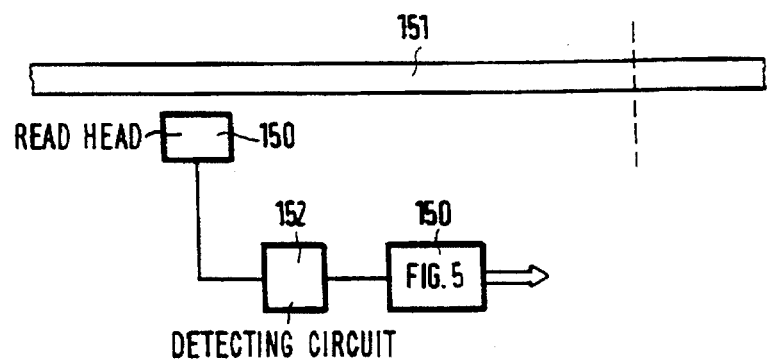
FIG. 10 shows a reading device in accordance with the invention.

FIG. 10 shows a reading device in which a decoding device according to the invention is used, for example, the decoding device 150 shown in FIG. 11. The reading device comprises a read head 150 of a customary type for reading a record carrier 150 according to the invention on which an information pattern corresponding to the modulated signal 7 is written. With it, the read head 150 produces an analog read signal which is modulated in accordance with the information pattern read by the read head 150. This read signal is converted to a binary signal which is fed to the decoding circuit 153, the conversion being effected by a detecting circuit 152 of a customary type, for example, a so-called partial response detector.

I claim:

1. A method of converting a sequence of m-bit information words to a modulated binary signal, where m is an integer, in which method an n-bit code word is delivered for each received information word from the sequence, where n is an integer exceeding m, and the delivered code words are converted to the modulated signal, which comprises bit cells having a first signal value and bit cells having a second signal value, and comprises for each of the delivered code words a corresponding signal portion, in which method, when one of the code words is assigned to one of the information words to be converted, this code word is selected from a set of code words, which set depends on a coding state determined after a code word has been delivered and which state is related to a digital sum value at the end of the modulated signal portion that corresponds to the delivered code word, which digital sum value denotes for a directly preceding portion of the modulated signal a running value of a difference between the number of bit cells having the first signal value and the number of bit cells having the second signal value, wherein at least one of the digital sum values determines a first or a second coding state of a pair of coding states of a first type, the first or second coding state of the pair being determined in response to the information word that corresponds to the previously delivered code word, where the code word sets belonging to each pair of coding states of the first type do not contain any code word in common.

2. The method as claimed in claim 1, wherein when at least a number of the code words are delivered, the determined coding state is of a second type, which coding state of the second type is independent of the information word that corresponds to such delivered code word, where each digital sum value lying within a predefined range determines one of the coding states of the second coding state, or, together with the information word belonging to such delivered code word, the first or the second coding state of such pair of coding states of the first type.

3. The method as claimed in claim 1, wherein the sets of code words belonging to the pairs of coding states of the first type are mutually distinguishable based upon the logical values of bits at p predefined bit positions in the code words, where p is an integer smaller n.

4. The method as claimed in claim 3, wherein sync words are inserted into the code word sequence, which sync words show bit patterns that cannot occur in the bit string formed by the code words, where sync words are used having different bit patterns and each sync word used depends on the coding state, and once a sync word has been inserted, a predefined coding state is determined for the conversion of the next information word, which sync words are mutually distinguishable based upon the logical values of bits at predefined bit positions in a manner that corresponds to the manner in which the sets of code words belonging to the coding states of the first type are mutually distinguishable.

5. The method as claimed in claim 1, wherein n is odd and the code words in the sets related to even sum values are the inverse of the code words in the sets related to odd sum values.

6. The method as claimed in claim 3, wherein m is equal to 8 and n is equal to 9.

7. The method as claimed in claim 5, characterized in that p is equal to 2.

8. The method as claimed in claim 6, wherein the number of different digital sum values to which a coding state is related is equal to 8, the two extreme values of the 8 different digital sum values being related to a coding state of the second type, the remaining values of the 8 different sum values being related each to two coding states of the first type.

9. The method as claimed in claim 8, wherein the code word sets comprise only those code words for which the digital sum values between the ends of the signal portions corresponding to the code words remain within a range of 10 different values.

10. The method of manufacturing a record carrier in which by implementing the method as claimed in claim 1, a modulated signal is generated and, subsequently, the record carrier is given an information pattern that represents this signal.

11. A device for converting a sequence of m-bit information words to a modulated binary signal, where m is an integer, the device comprising an m-to-n converter for converting each of the m-bit information words from the sequence to an n-bit code word, where n is an integer exceeding m, converter means for converting the code words converted by the m-to-n converter to the modulated signal, which signal comprises bit cells having a first signal value and bit cells having a second signal value and comprises for each of the delivered code words a corresponding signal portion, determining means for determining a coding state related to a digital sum value at the end of the modulated signal portion that corresponds to the delivered code word, which digital sum value denotes for a directly preceding modulated signal portion a running value of a difference between the number of bit cells having the first signal value and the number of bit cells having the second signal value, the m-to-n converter comprising means for selecting for the conversion a code word from a set of code words that depends on the coding state, wherein the means for determining the coding state are arranged to determine at least for a number of digital sum values a first or a second coding state of a pair of coding states of a first type, and comprises means for determining the first or second coding state of the pair in response to the information word that corresponds to the previously delivered code word, where the sets of code words belonging to each pair of coding states of the first type do not contain any code word in common.

12. The device as claimed in claim 11, wherein the sets of code words belonging to the pairs of coding states of the first type are mutually distinguishable based upon the logical values of bits on p predefined positions in the code words, where p is an integer smaller than or equal to n.

13. The device as claimed in claim 12, wherein further comprising means for inserting sync words between the code words, which sync words present bit patterns that cannot occur in the bit sequence formed by the code words, and means for selecting sync words to be inserted which sync words have different bit patterns in dependence on the established coding state, these sync words being mutually distinguishable based on the logical values of bits on predefined bit positions in a manner corresponding to the way in which the sets of code words belonging to the coding states of the second type are mutually distinguishable.

14. The device as claimed in claim 1, wherein n is odd, and the device further comprises controllable inverter means for realising an inversion of the information signal portions in the modulated signal which signal portions correspond to the delivered code words, and means for alternately activating and deactivating the inverter means with a timing that corresponds to the delivery of the code words.

15. The device as claimed in claim 11, wherein in that m is equal to 8 and n is equal to 9.

16. The device as claimed in claim 15, wherein in that p is equal to 2.

17. The device as claimed in claim 15, wherein in that the number of different digital sum values to which a coding state is related is equal to 8, where the two extreme values of the 8 different digital sum values are related to a coding state of the second type, and the remaining values of the 8 different sum values being are related each to two coding states of the first type.

18. The device as claimed in claim 17, wherein in that the sets of code words contain only those code words for which the digital sum value between the ends of the signal portions corresponding to the code words continues to be in a range of 10 different values.

19. A device for recording information, which device comprises the coding device as claimed in claim 11 for converting a sequence of information words representing the information to a modulated signal and means for writing on the record carrier an information pattern corresponding to the signal.

20. A signal comprising a sequence of q successive information signal portions which represent q information words, where q is an integer, in which signal each of the information signal portions comprises n bit cells which have a first or a second signal value, wherein each information signal portion belonging to a predefined group of information signal portions uniquely establishes an information word, the number of successive bit cells having the same signal value is greater than or equal to 1 and smaller than or equal to k, where k is an integer, and together with an adjacent information signal portion each information signal portion belonging to a second group of information signal portions uniquely establishes an information word.

21. The signal as claimed in claim 20, characterized in that the digital sum value at the end of the information signal portions lies in a predefined range comprising N different values.

22. The signal as claimed in claim 20, wherein in that the number of bit cells for each information signal portion is odd and the information signal portions are divided into even and odd information signal portions which are alternating, and the relation between the even information signal portions and the information words is equal to the relation between the inverse of the odd signal portions and the information words.

23. The signal as claimed in claim 20, wherein in that n is equal to 9.

24. The signal as claimed in claim 20, wherein in that the information signal potions of the first group are distinguishable from the information signal portions of the second group based upon the signal values of bit cells at p predefined positions in the information signals, where p is an integer smaller than n.

25. The signal as claimed in claim 24, wherein in that p is equal to 2.

26. The signal as claimed in claim 24, wherein in that the p bit cells at said positions are the first and eighth bit cells after the end of the information signal portion concerned.

27. The signal as claimed in claim 24, wherein in that the signal comprises sync signal portions which present bit cell patterns which do not occur in the sequence of successive information signal portions whilst each of the information signal portions of the second group either with an adjacent sync word or with an adjacent information signal uniquely establishes an information word.

28. A record carrier on which the signal as claimed in claim 20 is recorded in a track in which information patterns represent the signal portions, which information patterns comprise first and second parts alternating in the direction of the track, wherein the first parts present first detectable properties and the second parts present second properties distinguishable from the first properties, and the parts having the first properties represent bit cells having the first signal value and the parts having the second properties represent bit cells having the second signal value.

29. A decoding device for converting the signal as claimed in claim 20 to a sequence of m-bit information words, the device comprising converter means for converting the signal to a bit string of bits having a first or second logical value, this bit string comprising a sequence of n-bit code words that correspond to the information signal portions, and converter means for converting the sequence of code words to the sequence of information words, where each of the code words to be converted is assigned an information word in dependence on the code word to be converted, wherein the converter means are arranged for assigning the information word in dependence on the logical values of the bits in the bit string which are situated at p predefined positions with respect to the corresponding code word.

30. The decoding device as claimed in claim 29, wherein in that n is odd, the device further comprises adapter means for adapting a decoding state after a code word conversion and the converter means are arranged for converting code words to information words in accordance with the converting rules which depend on the decoding state.

31. The decoding device as claimed in claim 30, wherein the converter means comprise inverter means for inverting a code word to be converted before it is converted, and the device further comprises means for activating or not activating the inverter means in response to the decoding state.

32. The decoding device as claimed in claim 29, wherein in that n is equal to 9, and m is equal to 8 and where p is equal to 2.

33. The decoding device as claimed in claim 32, characterized in that the p predefined bit positions are the first and eighth bit positions past the end of the code word concerned.

34. The decoding device as claimed in claim 19, wherein in the device further comprises detection means for detecting sync words having bit patterns that cannot be formed by the successive code words in the sequence.

35. A reading device for reading a record carrier on which information is recorded in the form of an information pattern, the device comprising converter means for converting the information pattern to a corresponding binary read signal, and a decoding device as claimed in claim 29 for converting the binary read signal to a sequence of m-bit information words.

* * * * *

UNITED STATES PATENT AND TRADEMARK OFFICE
CERTIFICATE OF CORRECTION

PATENT NO. : 5,642,113
DATED : June 24, 1997
INVENTOR(S) : Kornelis A. Schouhamer Immink It is certified that error appears in the above-identified patent and that said Letters Patent is hereby corrected as shown below:

Claim 13, line 1 delete "wherein".
Claim 14, line 1 change "claim 1" to "claim 11".
Claim 15, line 1 delete " in that"
Claim 16, line 1 delete " in that"
Claim 17, line 1 delete " in that"
Claim 18, line 1 delete " in that"
Claim 21, line 1 change "characterized in that" to "Wherein".
Claim 22, line 1 delete " in that"
Claim 23, line 1 delete " in that"
Claim 24, line 1 delete " in that"
Claim 25, line 1 delete " in that"
Claim 26, line 1 delete " in that"
Claim 27, line 1 delete " in that"
Claim 27, line 4 change "wilst" to "where".

UNITED STATES PATENT AND TRADEMARK OFFICE
CERTIFICATE OF CORRECTION

PATENT NO. : 5,642,113

DATED : June 24, 1997

INVENTOR(S) : Kornelis A. Schouhamer Immink

It is certified that error appears in the above-identified patent and that said Letters Patent is hereby corrected as shown below:

Claim 28, line 5 change "wherein" to "where".

Claim 30, line 2 delete "in that"

Claim 32, line 2 delete "where"

Claim 33, line 1 change "characterized in that" to "wherein"

Signed and Sealed this

Twelfth Day of January, 1999

Attest:

*Attesting Officer*  *Acting Commissioner of Patents and Trademarks*